United States Patent
Higashikawa et al.

(10) Patent No.: US 11,217,711 B2
(45) Date of Patent: Jan. 4, 2022

(54) PHOTOVOLTAIC DEVICE, SOLAR CELL STRING OF PHOTOVOLTAIC DEVICES, AND SOLAR CELL MODULE INCLUDING EITHER PHOTOVOLTAIC DEVICE OR SOLAR CELL STRING

(71) Applicant: SHARP KABUSHIKI KAISHA, Sakai (JP)

(72) Inventors: Makoto Higashikawa, Sakai (JP); Yixiao Song, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/626,860

(22) PCT Filed: Jul. 9, 2018

(86) PCT No.: PCT/JP2018/025895
§ 371 (c)(1),
(2) Date: Dec. 26, 2019

(87) PCT Pub. No.: WO2019/013167
PCT Pub. Date: Jan. 17, 2019

(65) Prior Publication Data
US 2020/0227574 A1    Jul. 16, 2020

(30) Foreign Application Priority Data

Jul. 11, 2017 (JP) .............................. JP2017-135626

(51) Int. Cl.
*H01L 31/0224* (2006.01)
*H01L 31/05* (2014.01)
(Continued)

(52) U.S. Cl.
CPC ...... *H01L 31/022441* (2013.01); *H01L 31/05* (2013.01); *H01L 31/0682* (2013.01); *H01L 31/0747* (2013.01)

(58) Field of Classification Search
CPC .......... H01L 31/022441; H01L 31/048; H01L 31/0516; H01L 31/0682; H01L 31/0747; H01L 31/05
See application file for complete search history.

(56) References Cited

U.S. PATENT DOCUMENTS

| | | | | |
|---|---|---|---|---|
| 2011/0120530 A1* | 5/2011 | Isaka | ................. | B32B 17/10018 136/251 |
| 2016/0163898 A1* | 6/2016 | Harada | ............. | H01L 31/02363 136/255 |
| 2016/0163903 A1* | 6/2016 | Yang | ..................... | H01L 31/188 136/251 |

FOREIGN PATENT DOCUMENTS

| | | |
|---|---|---|
| WO | 2009/025147 A1 | 2/2009 |
| WO | 2016/132902 A1 | 8/2016 |

* cited by examiner

*Primary Examiner* — Mayla Gonzalez Ramos
(74) *Attorney, Agent, or Firm* — ScienBiziP, P.C.

(57) ABSTRACT

A photovoltaic device includes: a p-type diffusion layer (11) and a n-type diffusion layer (12) on a back face of a semiconductor substrate (1); electrodes (4 to 6); and a wiring board (8). The electrodes (4, 6) are disposed on the p-type diffusion layer (11), and the electrodes (5) are disposed on the n-type diffusion layer (12). The wiring board (8) has wires (82) connected to the electrodes (4, 6) by conductive adhesive layers (7) and wires (83) connected to the electrodes (5) by the conductive adhesive layers (7). The electrodes (6) are disposed, on both ends of the n-type diffusion layer (12) with respect to the x-axis direction, between an end region of the n-type diffusion layer (12) and an edge of the semiconductor substrate (1).

8 Claims, 22 Drawing Sheets

(51) Int. Cl.
*H01L 31/068* (2012.01)
*H01L 31/0747* (2012.01)

(a)

(b)

(c)

(d)

(e)

(f)

(g)

(h)

(i)

(f)

(g)

(h)

(i)

PHOTOVOLTAIC DEVICE, SOLAR CELL STRING OF PHOTOVOLTAIC DEVICES, AND SOLAR CELL MODULE INCLUDING EITHER PHOTOVOLTAIC DEVICE OR SOLAR CELL STRING

TECHNICAL FIELD

The present invention relates to photovoltaic devices, solar cell strings of photovoltaic devices, and solar cell modules including either a photovoltaic device or a solar cell string.

BACKGROUND ART

PCT International Application Publication No. WO2016/132902 discloses a back-contact solar cell as a photovoltaic device. The photovoltaic device includes a photovoltaic element, a wiring sheet, a first semiconductor film disposed on a first face of a semiconductor substrate, a second semiconductor film disposed on the first face of the semiconductor substrate, a first electrode disposed on the first semiconductor film, and a second electrode disposed on the second semiconductor film. The first electrode surrounds the second electrode with a distance between the first electrode and the second electrode. The wiring sheet has a first wire connected electrically to the first electrode and a second wire connected electrically to the second electrode.

SUMMARY OF INVENTION

In PCT International Application Publication No. WO2016/132902, since the first electrode surrounds the second electrode, the first electrode is connected on the periphery of the substrate. A typical solar cell substrate is prepared by slicing a wafer and is not subjected to, for example, polishing for cost reducing reasons. The substrate therefore has an irregular peripheral edge. Providing an electrode near the edge will increase the possibility of short circuits and other electrical defects. If the electrode is to be formed up to just short of reaching the edge to prevent this from happening, it becomes difficult to continuously dispose an electrode surrounding the second electrode and pattern it continuously. Meanwhile, if the electrode is to be formed further inside, sufficiently away from the edge, to prevent it from happening, it becomes difficult to achieve desirable properties.

In view of this situation, the present invention, in an embodiment thereof, provides a photovoltaic device capable of providing improved properties.

The present invention, in another embodiment thereof, provides a solar cell string of photovoltaic devices capable of providing improved properties.

The present invention, in a further embodiment thereof, provides a solar cell module including either a photovoltaic device capable of providing improved properties or a solar cell string of such photovoltaic devices.

Structure 1

The present invention, in an embodiment thereof, is directed to a photovoltaic device including a semiconductor substrate, a first semiconductor layer, a second semiconductor layer, a plurality of first electrodes, a plurality of second electrodes, first non-connecting regions, second non-connecting regions, first wires, second wires, and a plurality of third electrodes. The semiconductor substrate is of a first conductivity type. The first semiconductor layer is of the first conductivity type, disposed on one of two faces of the semiconductor substrate, and includes regions spaced apart from each other in a first direction. The second semiconductor layer is of a second conductivity type opposite to the first conductivity type, disposed on the face of the semiconductor substrate, and includes regions arranged alternately with the first semiconductor layer when viewed along the first direction. The first electrodes are disposed on the first semiconductor layer and have a length in a second direction perpendicular to the first direction. The second electrodes are disposed on the second semiconductor layer and have a length in the second direction. The first wires are connected electrically to the first electrodes in the first direction. The second wires are connected electrically to the second electrodes in the first direction. The first non-connecting regions are disposed between those second electrodes which are adjacent in the first direction, the first non-connecting regions inhibiting electrical connection between the first electrodes and the second wires. The second non-connecting regions are disposed between those first electrodes which are adjacent in the first direction, the second non-connecting regions inhibiting electrical connection between the second electrodes and the first wires. The third electrodes are disposed between at least one of two ends of the first semiconductor layer with respect to the second direction and an edge of the semiconductor substrate facing the at least one end, the third electrodes being connected electrically to the second wires.

According to structure 1, the third electrodes are disposed closer to the edge of the semiconductor substrate than the first semiconductor layer (first electrodes) is to the edge and connected electrically to the second wires.

The second electrodes do not constitute a continuous body surrounding the first electrodes and include a plurality of electrodes spaced apart from each other in the first direction. The structure is therefore unlikely to suffer from adverse effects of broken wires and other defects that may occur in patterning.

The provision of the third electrodes enables collection of more of the carriers generated in this region.

If electrodes and wires are provided parallel to each other, it is relatively difficult to connect the third electrodes to the second wires without touching the first electrodes. However, the third electrodes can be connected to the second wires by providing the second wires extending lengthwise in the first direction. In this structure, the third electrodes can be well connected to the second wires, especially near the edges of the semiconductor substrate.

The structure therefore provides a photovoltaic device capable of providing improved properties.

Structure 2

In structure 1, at least one of two ends of each of the second electrodes is, with respect to the second direction, located closer to the edge of the semiconductor substrate than an end of the associated one of the first electrodes is to the edge.

According to structure 2, the second electrodes extend toward the edges of the semiconductor substrate, thereby enabling collection of more of the carriers generated in this region. This structure is unlikely to suffer from adverse effects of shape variations near the edges of the semiconductor substrate than a structure where the second electrodes constitute a continuous body surrounding the first electrodes near the edges of the semiconductor substrate. The structure therefore facilitates the designing of the patterning mask and aligning in the patterning process, which reduces patterning defects.

The structure therefore further improves the properties of the photovoltaic device.

Structure 3

In structure 1, the third electrodes are positioned in line with the first electrodes with respect to the second direction.

According to structure 3, the third electrodes are positioned in line with the first electrodes with respect to the second direction. Therefore, the third electrodes can be formed by patterning simultaneously with the first and second electrodes. The structure thus enables simple and convenient fabrication and reduces manufacturing cost.

Structure 4

In structure 2, the third electrodes and the first electrodes have substantially equal widths.

According to structure 3, the third electrodes and the first electrodes have substantially equal widths. Therefore, the third electrodes can be formed by patterning simultaneously with the first and second electrodes. The structure, for example, alleviates restraints on the design of the mechanical strength of a metal mask used in the formation of electrodes. The structure thus leads to optimal design of the width, shape, and other properties of the electrodes.

Structure 5

In structure 1, the third electrodes are positioned between the second electrodes spaced apart from each other in the first direction near the edge of the semiconductor substrate with respect to the second direction.

According to structure 5, carriers are collected between the second electrodes spaced apart from each other in the first direction as well as in regions where the second electrodes are provided.

The structure therefore further improves the properties of the photovoltaic device.

Structure 6

In any one of structures 1 to 5, at least one of the first and second semiconductor layers is an amorphous semiconductor layer.

An amorphous semiconductor layer is, although very thin, required to reliably generate diffusion potential and exhibit passivation properties. Therefore, the structure is likely to suffer from adverse effects of out-of-pattern electrodes, broken wires, and other defects that may occur in patterning. A solar cell substrate is not subjected to, for example, edge polishing for cost reducing reasons and consequently has unstable edge shapes. The solar cell substrate is hence likely to suffer from the adverse effects, especially when the semiconductor film is amorphous. Structure 4 is therefore preferable.

Structure 7

The present invention, in another embodiment thereof, is directed to a solar cell string including a plurality of photovoltaic elements, and a wiring board connected electrically to the photovoltaic elements.

The photovoltaic elements each include a semiconductor substrate, a first semiconductor layer, a second semiconductor layer, a plurality of first electrodes, a plurality of second electrodes, first non-connecting regions, second non-connecting regions, and a plurality of third electrodes. The semiconductor substrate is of a first conductivity type. The first semiconductor layer is of the first conductivity type, disposed on one of two faces of the semiconductor substrate, and includes regions spaced apart from each other in a first direction. The second semiconductor layer is of a second conductivity type opposite to the first conductivity type, disposed on the face of the semiconductor substrate, and includes regions arranged alternately with the first semiconductor layer when viewed along the first direction. The first electrodes are disposed on the first semiconductor layer, are spaced apart from each other in the first direction, and have a length in a second direction perpendicular to the first direction. The second electrodes are disposed on the second semiconductor layer, are spaced apart from each other in the first direction, and have a length in the second direction. The first non-connecting regions are disposed between those second electrodes which are adjacent in the first direction. The second non-connecting regions are disposed between those first electrodes which are adjacent in the first direction. The third electrodes are disposed between at least one of two ends of the first semiconductor layer with respect to the second direction and an edge of the semiconductor substrate facing the at least one end. The wiring board includes: first wires connected electrically to the first electrodes in the first direction; and second wires connected electrically to the second electrodes and the third electrodes in the first direction. The first non-connecting regions inhibit electrical connection between the first electrodes and the second wires. The second non-connecting regions inhibit electrical connection between the second electrodes and the first wires.

Structure 7 achieves the same advantages as structure 1 above.

Structure 8

The present invention, in a further embodiment thereof, is directed to a solar cell module including either the photovoltaic device of any one of structures 1 to 6 sealed with resin or the solar cell string of structure 7 sealed with resin.

Structure 8 imparts good properties to the solar cell module in a stable manner. In addition, the structure alleviates deterioration of the properties of the solar cell module that may occur in long-term use, thereby improving its reliability.

Advantageous Effects of Invention

The present invention, in an embodiment thereof, provides a photovoltaic device capable of providing improved properties.

DESCRIPTION OF EMBODIMENTS

The following will describe embodiments of the present invention in detail in reference to drawings. Identical or equivalent members will be denoted by the same reference signs throughout the drawings, and description thereof is not repeated.

Embodiment 1

Figure 1A:
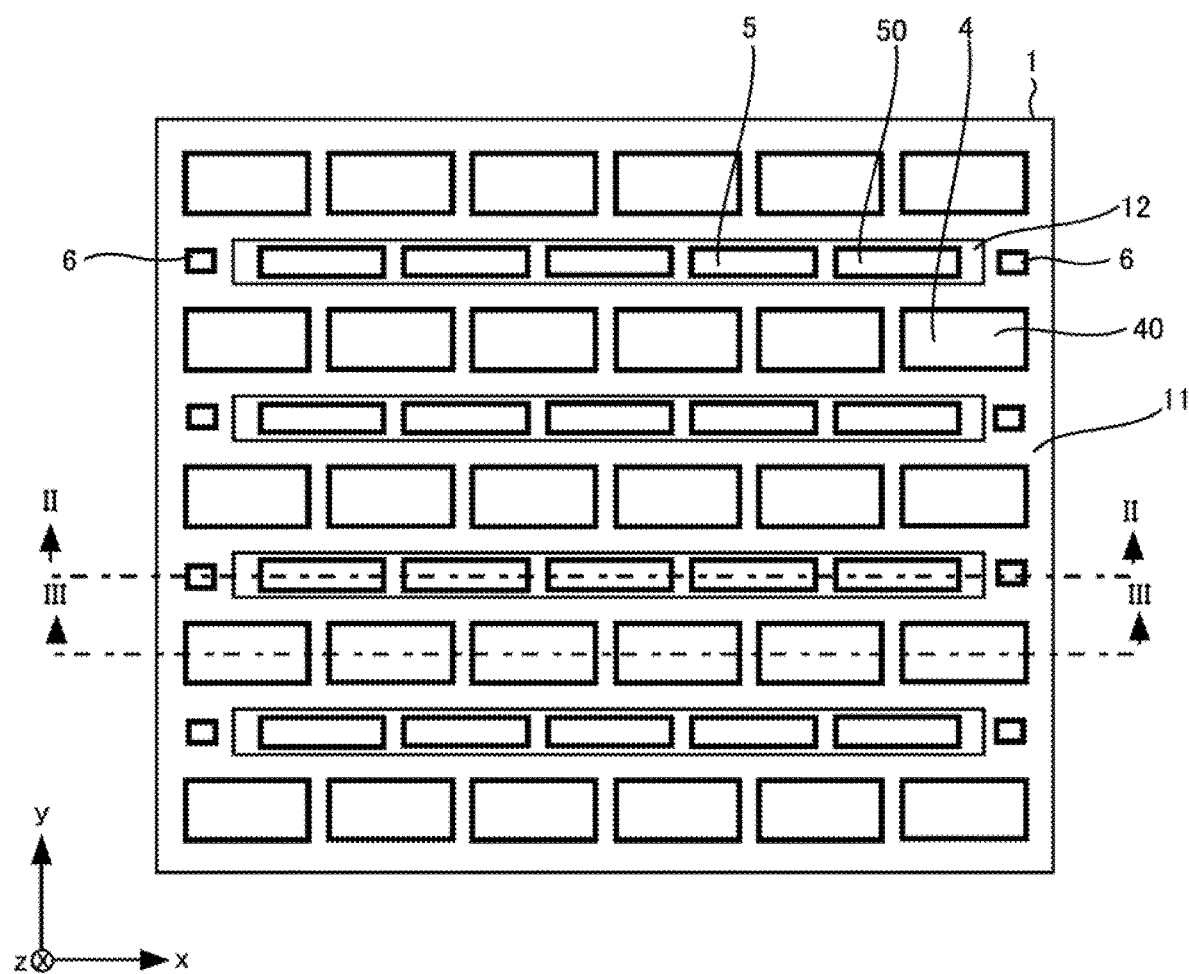
FIG. 1A is a first plan view of a photovoltaic device in accordance with Embodiment 1.
Figure 1B:
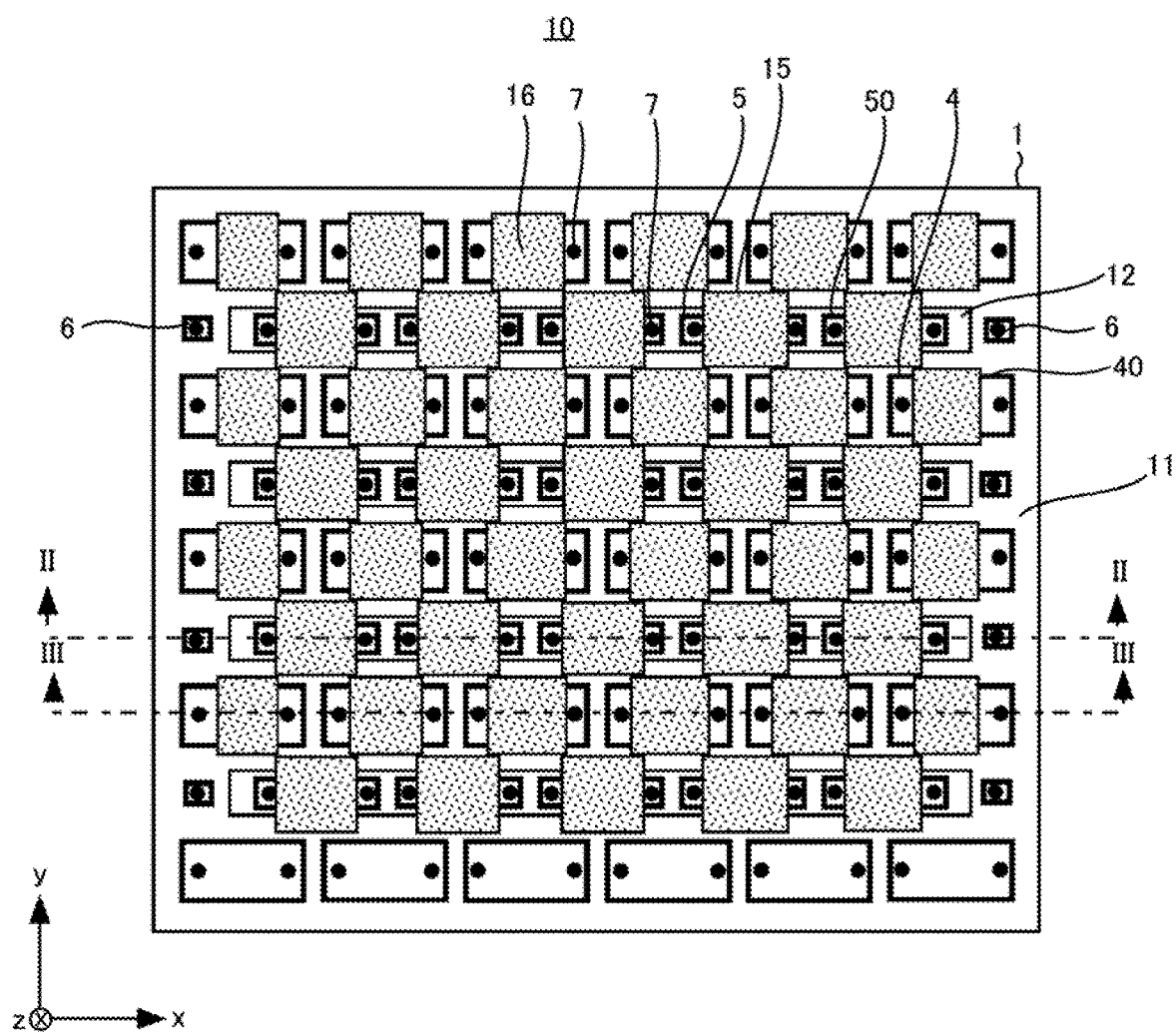
FIG. 1B is a second plan view of the photovoltaic device in accordance with Embodiment 1.
Figure 1C:
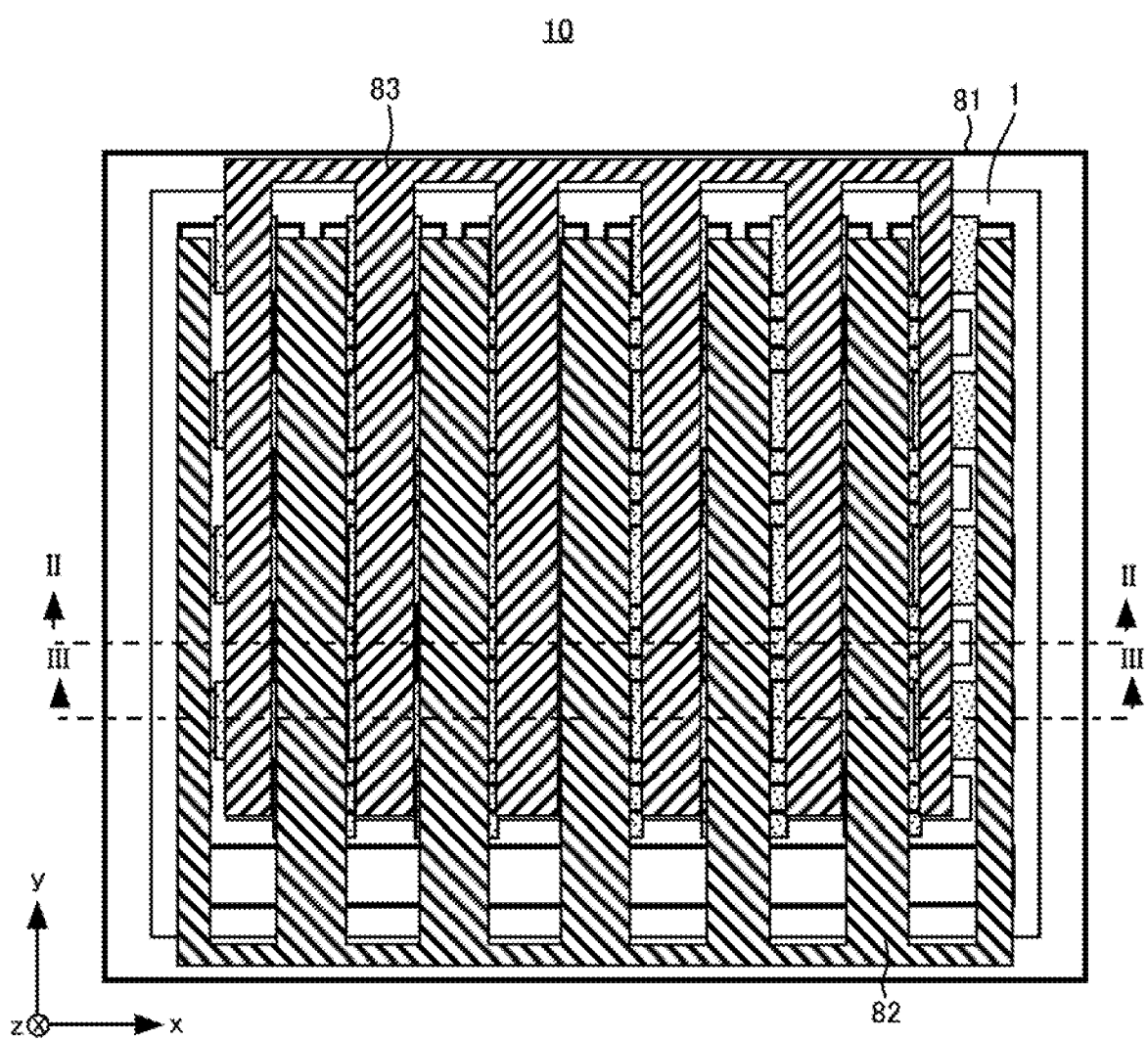
FIG. 1C is a third plan view of the photovoltaic device in accordance with Embodiment 1.
Figure 2:
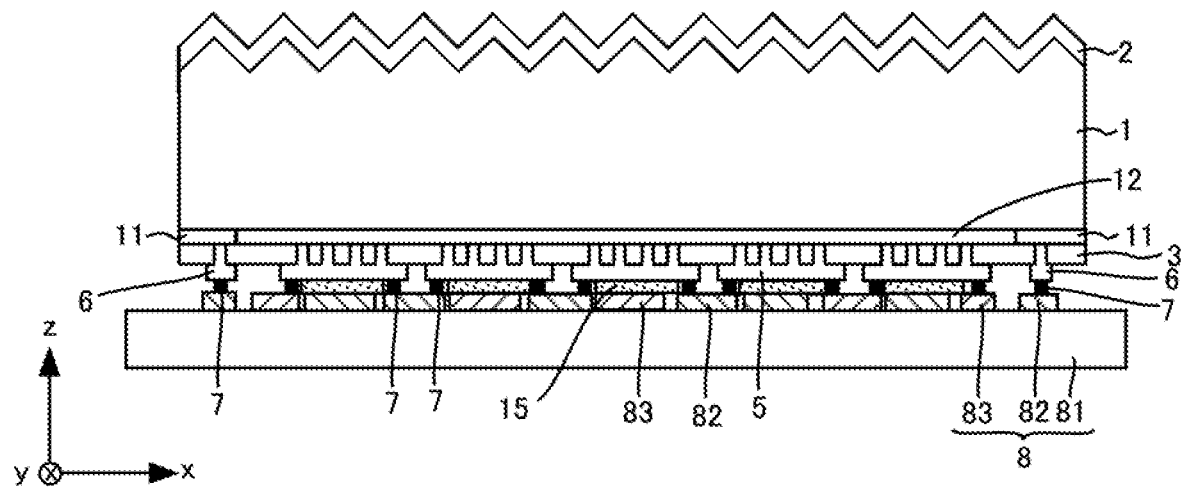
FIG. 2 is a cross-sectional view of the photovoltaic device, taken along line II-II in FIGS. 1A to 1C.
Figure 3:
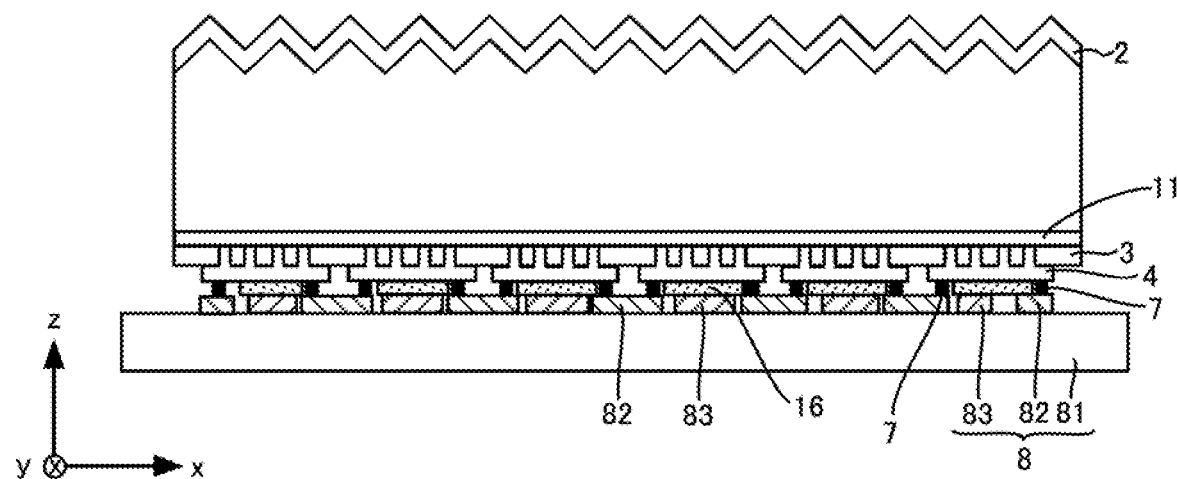
FIG. 3 is a cross-sectional view of the photovoltaic device, taken along line III-III in FIGS. 1A to 1C.

FIGS. 1A to 1C are first to third plan views, respectively, of a photovoltaic device in accordance with Embodiment 1. FIG. 2 is a cross-sectional view of the photovoltaic device, taken along line II-II in FIGS. 1A to 1C. FIG. 3 is a cross-sectional view of the photovoltaic device, taken along line III-III in FIGS. 1A to 1C. FIG. 1A shows, in plan view, a p-type diffusion layer, n-type diffusion layers, and electrodes of the photovoltaic device as viewed from a side opposite a light-incident side thereof. FIG. 1B shows, in plan view, conductive adhesive layers and non-connecting regions of the photovoltaic device as viewed from the side opposite the light-incident side. FIG. 1C shows, in plan view, wires and an insulating substrate of the photovoltaic device as viewed from the side opposite the light-incident side. FIG. 1C depicts an insulating substrate 81 as being transparent, so that the wires can be visible. FIGS. 1A to 1C, 2, and 3 define x-, y-, and z-axes as indicated therein.

Referring to FIGS. 1A to 1C, 2, and 3, a photovoltaic device 10 in accordance with Embodiment 1 includes a semiconductor substrate 1, an antireflective film 2, a passivation film 3, electrodes 4 to 6, conductive adhesive layers 7, a wiring board 8, and non-connecting regions 15 and 16.

The semiconductor substrate 1 is composed of, for example, a n-type monocrystalline silicon substrate and has a thickness of 100 to 200 µm. As an example, the semiconductor substrate 1 has a (100) crystal orientation and a specific resistance of 1 to 10 Ωcm. The semiconductor substrate 1 has texture on a light-incident-side surface thereof.

The semiconductor substrate 1 includes a p-type diffusion layer 11 and n-type diffusion layers 12 on a surface opposite the light-incident-side surface where the texture is formed. The p-type diffusion layer 11 is arranged so as to surround the n-type diffusion layers 12 in the x-y plane.

The p-type diffusion layer 11 includes regions spaced apart from each other in the y-axis direction, each region including a p-type diffusion layer. Each n-type diffusion layer 12 includes regions arranged alternately with the p-type diffusion layers when viewed along the y-axis direction, each region including a n-type diffusion layer.

The p-type diffusion layer 11 extends in the x-axis direction beyond the ends of the n-type diffusion layers 12 and toward the edges of the semiconductor substrate 1.

The p-type diffusion layer 11 contains, for example, boron (B) as a p-type impurity. The boron concentration is, for example, from $1 \times 10^{19}$ atoms/cm$^{-3}$ to $1 \times 10^{20}$ atoms/cm$^{-3}$. The p-type diffusion layer 11 has a depth of, for example, 0.1 µm to 0.5 µm.

The n-type diffusion layers 12 contain, for example, phosphorus (P) as a n-type impurity. The phosphorus concentration is, for example, from $1 \times 10^{19}$ atoms/cm$^{-3}$ to $1 \times 10^{20}$ atoms/cm$^3$. The n-type diffusion layers 12 have a depth of, for example, 0.1 µm to 0.5 µm.

The antireflective film 2 is disposed on the light-incident-side surface of the semiconductor substrate 1. The antireflective film 2 includes, for example, a stack of silicon oxide and silicon nitride. In this example, the silicon oxide is in contact with the semiconductor substrate 1, and the silicon nitride is in contact with the silicon oxide. The antireflective film 2 has a thickness of, for example, 100 to 1,000 nm.

The passivation layer 3 is disposed on the surface opposite the light-incident-side surface of the semiconductor substrate 1. The passivation film 3 is disposed on the p-type diffusion layer 11 and the n-type diffusion layers 12 and in contact with the p-type diffusion layer 11 and the n-type diffusion layers 12. FIGS. 1A to 1C omit the passivation film 3 which is actually disposed on the p-type diffusion layer 11 and the n-type diffusion layers 12.

The passivation film 3 is composed of, for example, silicon oxide, silicon nitride, and alumina. The passivation film 3 has a thickness of, for example, 50 nm to 100 nm.

The electrodes 4 are disposed in contact with the p-type diffusion layer 11 and the passivation film 3 via a plurality of openings formed in the passivation film 3. The electrodes 4 include a plurality of electrodes 40 spaced apart from each other in the y-axis direction and arranged in the x-axis direction. The electrodes 40 are disposed on the p-type diffusion layer 11 and spaced apart from each other by prescribed distances in the x-axis direction (see FIGS. 1A and 3). The electrodes 4 may alternatively include a plurality of electrodes 40 spaced apart from each other in the x-axis direction or include a single electrode extending in the x-axis direction.

The electrodes 4 extend in the x-axis direction beyond the ends of the electrodes 5 toward the edges of the semiconductor substrate 1. The electrodes 4 preferably extend to or within 1 mm from the edges of the semiconductor substrate 1.

The electrodes 5 are disposed in contact with the n-type diffusion layers 12 and the passivation film 3 via a plurality of openings formed in the passivation film 3. The electrodes 5 include a plurality of electrodes 50 spaced apart from each other in the y-axis direction and arranged in the x-axis direction. The electrodes 50 are disposed on the n-type diffusion layers 12 and spaced apart from each other by prescribed distances in the x-axis direction (see FIGS. 1A and 2). The electrodes 5 may alternatively include a plurality of electrodes 50 spaced apart from each other in the x-axis direction or include a single electrode extending in the x-axis direction.

The electrodes 6 are disposed, on both ends of each n-type diffusion layer 12 with respect to the x-axis direction, in line with the n-type diffusion layer 12 with respect to the x-axis direction between those electrodes 4 which are adjacent in the y-axis direction (see FIGS. 1A and 2). The electrodes 6 are in contact with the p-type diffusion layer 11 and the passivation film 3 via openings formed in the passivation film 3. The electrodes 6 preferably have ends thereof at or within 1 mm from the edges of the semiconductor substrate 1.

The electrodes 4 to 6 are composed of, for example, silver and have respective thicknesses ranging from 100 to 3,000 nm. The electrodes 6 have a width that is smaller than that of the electrodes 5.

The conductive adhesive layers 7 are disposed at the ends of the electrodes 4 and 5 with respect to the x-axis direction in contact with the electrodes 4 and 5 and also on the electrodes 6 in contact with the electrodes 6 (see FIG. 1B). The conductive adhesive layers 7 on the electrodes 4 and 6 are connected electrically to wires 82 on the wiring board 8. The conductive adhesive layers 7 on the electrodes 5 are connected electrically to wires 83 on the wiring board 8 (see FIGS. 1B, 2, and 3). The conductive adhesive layers 7 are composed of, for example, a low-melting-point solder, a conductive adhesive and/or a conductive paste.

The wiring board 8 includes the insulating substrate 81 and the wires 82 and 83. The wires 82 and 83 are disposed on the insulating substrate 81. The wires 82 and 83 are shaped like a comb in a plan view (see FIG. 1C). The wires 82 extend in the y-axis direction and are connected electrically to the electrodes 4 and 6 by the conductive adhesive layers 7. Meanwhile, the wires 83 extend in the y-axis direction and are connected electrically to the electrodes 5 by the conductive adhesive layers 7.

To electrically connect the wires 82 to the electrodes 4 via the conductive adhesive layers 7, the electrodes 4 are connected, for example, at two sites by the conductive adhesive layers 7 to those two electrodes 40 which are adjacent in the x-axis direction (see FIGS. 1B and 1C). To electrically connect the wires 83 to the electrodes 5 via the conductive adhesive layers 7, the electrodes 5 are connected, for example, at two sites by the conductive adhesive layers 7 to those two electrodes 50 which are adjacent in the x-axis direction (see FIGS. 1B and 1C).

The insulating substrate 81 is composed of an insulating material such as a film of polyester, polyethylene naphthalate, or polyimide.

The wires 82 and 83 are composed of a conductive material such as a stack of aluminum, copper, silver, tin, and zinc.

The non-connecting regions 15 are provided between the electrodes 5 and the wires 82 between those electrodes 4 which are adjacent in the y-axis direction (see FIGS. 1B and 2). The non-connecting regions 15 inhibit electrical connection of the wires 82 to the electrodes 5 between those electrodes 4 which are adjacent in the y-axis direction. The non-connecting regions 15 preferably include an insulating layer formed on parts of the surfaces of the electrodes 5. In this preferable structure, the insulating layer is composed of an insulating resin or an inorganic material such as silicon nitride.

The non-connecting regions 16 are provided between the electrodes 4 and the wires 83 between those electrodes 5 which are adjacent in the y-axis direction (see FIGS. 1B and 3). The non-connecting regions 16 inhibit electrical connection of the wires 83 to the electrodes 4 between those electrodes 5 which are adjacent in the y-axis direction. The non-connecting regions 16 preferably include an insulating layer formed on parts of the surfaces of the electrodes 4. In this preferable structure, the insulating layer is composed of an insulating resin or an inorganic material such as silicon nitride.

As described above, the electrodes 4 and 6 are connected electrically to the wires 82 on the wiring board 8 by the conductive adhesive layers 7. The electrodes 5 are connected electrically to the wires 83 on the wiring board 8 by the conductive adhesive layers 7. The electrical connection between the electrodes 4 and 6 and the wires 82 and the electrical connection between the electrodes 5 and the wires 83 may be made by compression or any other method that can make electrical connection.

FIG. 1A shows a plurality of electrodes 4, a plurality of electrodes 5 and a plurality of n-type diffusion layers 12 when viewed along the y-axis direction. Their numbers are however not limited to any particular value.

FIG. 1A shows a plurality of electrodes 6 when viewed along the y-axis direction. There needs to be provided at least one electrode 6 when viewed along the y-axis direction. Their number is not limited to any particular value.

FIG. 1C shows a plurality of wires 82 and a plurality of wires 83 when viewed along the x-axis direction. Their numbers are however not limited to any particular value.

Figure 4:
FIG. 4 is a first manufacturing step diagram illustrating manufacturing steps for the photovoltaic device shown in FIGS. 1A to 1C, 2, and 3.
Figure 4:
Figure 4:
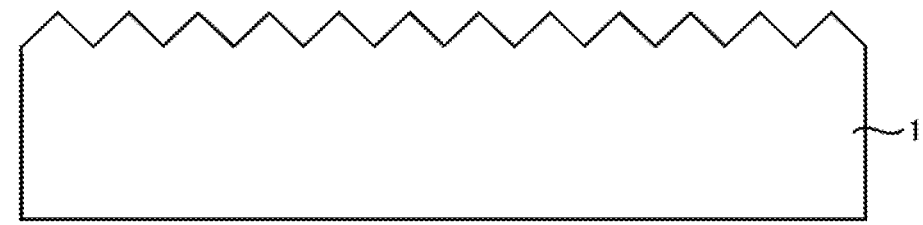
Figure 4:
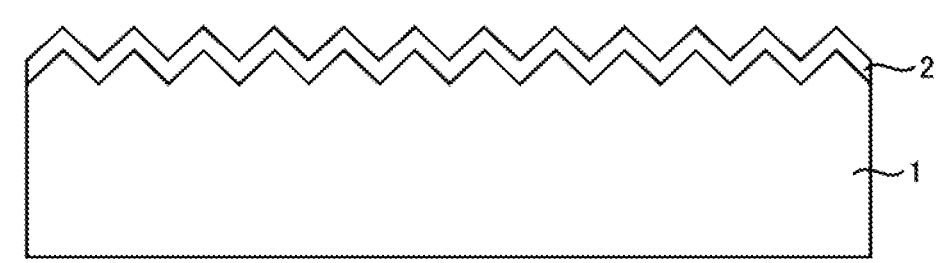
Figure 4:
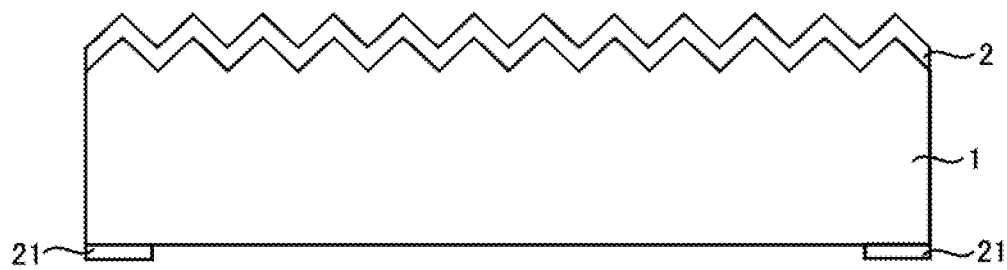
Figure 5:
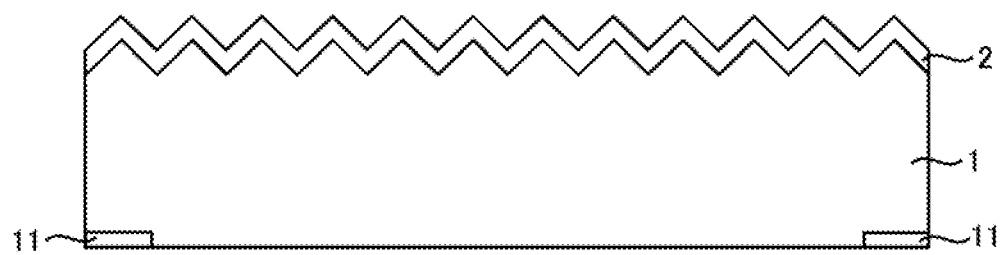
FIG. 5 is a second manufacturing step diagram illustrating manufacturing steps for the photovoltaic device shown in FIGS. 1A to 1C, 2, and 3.
Figure 5:
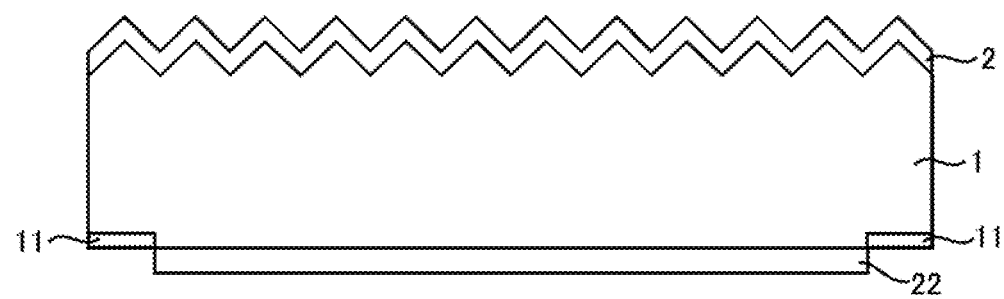
Figure 5:
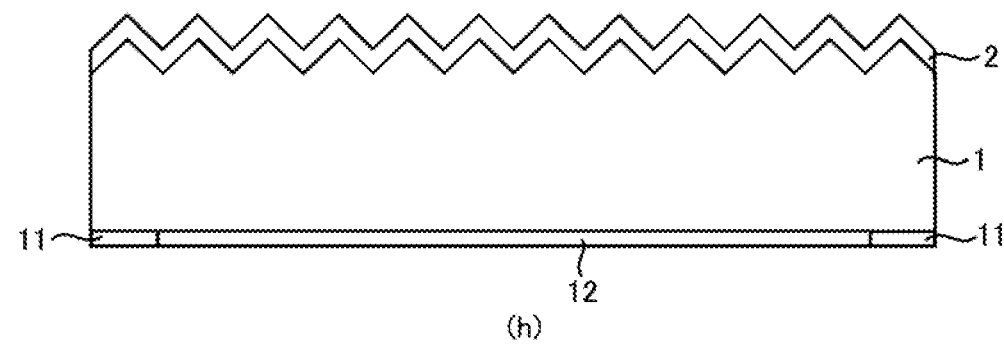
Figure 5:
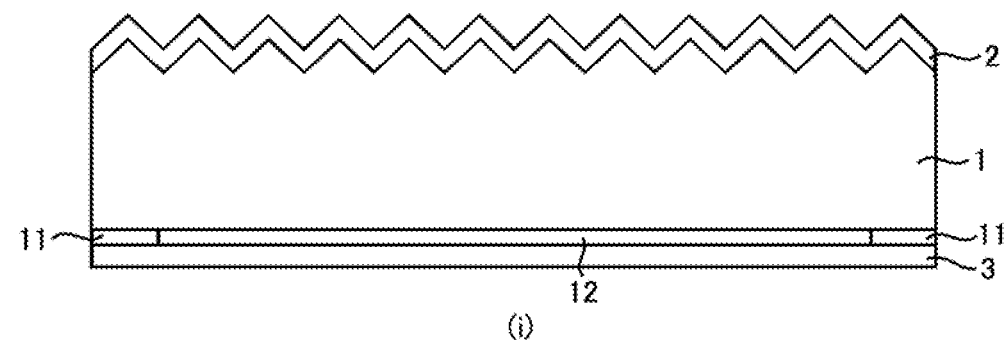
Figure 6:
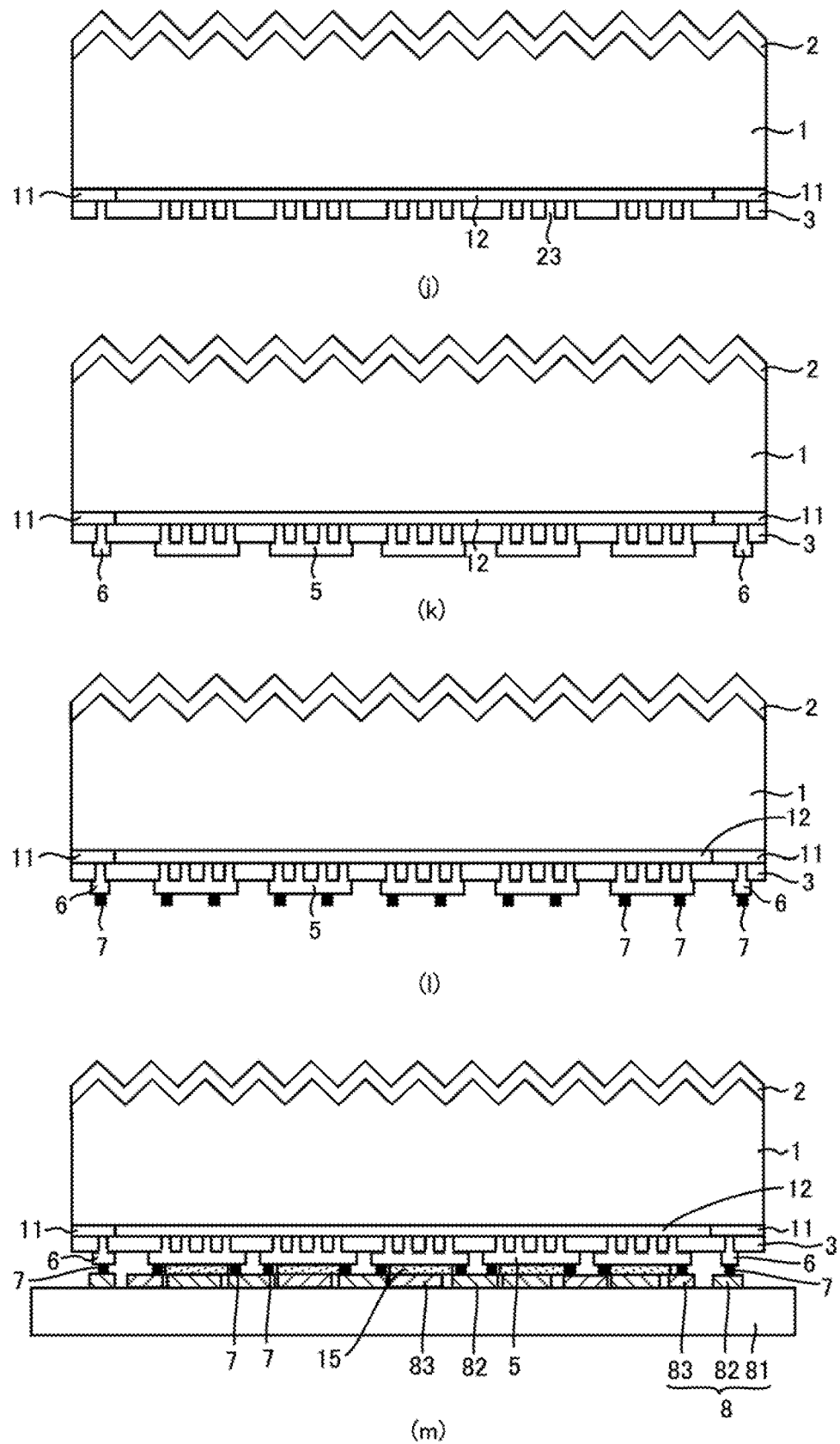
FIG. 6 is a third manufacturing step diagram illustrating manufacturing steps for the photovoltaic device shown in FIGS. 1A to 1C, 2, and 3.

FIGS. 4 to 6 are first to third manufacturing step diagrams, respectively, illustrating manufacturing steps for the photovoltaic device 10 shown in FIGS. 1A to 1C, 2, and 3. The manufacturing step diagrams in FIGS. 4 to 6 are drawn based on cross-sectional views taken along line II-II in FIGS. 1A to 1C.

Now referring to FIG. 4, a semiconductor substrate 1' is prepared at the start of the manufacture of the photovoltaic device 10 (see step (a) in FIG. 4). The semiconductor substrate 1' has the same crystal orientation, specific resistance, conductivity type, and thickness as the semiconductor substrate 1.

A protective film 20 is then formed on one of two faces of the semiconductor substrate 1' (see step (b) in FIG. 4). The protective film 20 is composed of, for example, silicon oxide and silicon nitride and formed by, for example, sputtering.

Thereafter, the semiconductor substrate 1' on which the protective film 20 has been formed is etched in an alkaline solution of, for example, NaOH or KOH (e.g., an aqueous solution of KOH (1 to 5 wt %) and isopropyl alcohol (1 to 10 wt %)). This step anisotropically etches a surface of the semiconductor substrate 1' that is opposite the face thereof carrying the protective film 20 thereon, thereby forming a pyramidal texture on that surface. The protective film 20 is then removed to obtain the semiconductor substrate 1 (see step (c) in FIG. 4).

Subsequently, the antireflective film 2 is formed on the surface of the semiconductor substrate 1 on which the texture has been formed (see step (d) in FIG. 4). More specifically, the antireflective film 2 is formed, for example, by sequentially depositing silicon oxide and silicon nitride on the semiconductor substrate 1 by sputtering.

Following step (d), a BSG (boron silicate glass) film 21 is formed on parts of the surface (back face) of the semiconductor substrate 1 that is opposite the surface thereof carrying the texture thereon (see step (e) in FIG. 4). The BSG film 21 has a thickness of, for example, 300 to 1,000 nm.

The BSG film 21 is thereafter processed with heat at 850 to 900° C. in order to diffuse boron (B) from the BSG film 21 to the semiconductor substrate 1. The remaining BSG film 21 is then removed in an aqueous solution of hydrogen fluoride, which forms the p-type diffusion layer 11 on the back face of the semiconductor substrate 1 (see step (f) in FIG. 5).

Subsequently, a PSG (phosphorus silicate glass) film 22 is formed on parts of the back face of the semiconductor substrate 1 (see step (g) in FIG. 5). The PSG film 22 has a thickness of, for example, 300 to 1,000 nm.

The PSG film 22 is thereafter processed with heat at 850 to 900° C. in order to diffuse phosphorus (P) from the PSG film 22 to the semiconductor substrate 1. The remaining PSG film 22 is then removed in an aqueous solution of hydrogen fluoride, which forms the n-type diffusion layers 12 on the back face of the semiconductor substrate 1 (see step (h) in FIG. 5).

The passivation film 3 is then formed on the p-type diffusion layer 11 and the n-type diffusion layers 12 (see step (i) in FIG. 5). More specifically, the passivation film 3 is formed on the p-type diffusion layer 11 and the n-type diffusion layers 12, for example, by depositing silicon oxide by sputtering.

Next, photoresist is applied onto the passivation film 3 and patterned by photolithography. The passivation film 3 is then etched using the patterned photoresist as a mask in order to form openings 23 in the passivation film 3 (see step (j) in FIG. 6).

Thereafter, a metal (e.g., silver) is deposited across the entire surface of the passivation film 3, which has the openings 23 therein, by, for example, vapor deposition. The deposited metal (e.g., silver) is patterned by photolithography using photoresist in order to form the electrodes 5 and 6 (see step (k) in FIG. 6). The electrodes 4 (not shown in step (k) in FIG. 6) are formed simultaneously with the electrodes 5 and 6.

Following step (k), a low-melting-point solder paste is provided in the form of dots on the electrodes 5 and 6 by printing or a like technique in order to form some of the conductive adhesive layers 7 (see step (1) in FIG. 6). The low-melting-point solder paste is provided in the form of dots also on the electrodes 4 in order to form the rest of the conductive adhesive layers 7.

Next, the insulating substrate 81 is prepared, which is approximately 150 μm thick. The semiconductor substrate 1 and the wiring board 8 are then attached together, with their positions adjusted in such a manner that the wires 82 and 83 will be substantially perpendicular to the electrodes 4 and 6 and the electrodes 5 respectively in order to establish electrical contacts in prescribed locations. Then, for example, pressure and heat are applied to the attached semiconductor substrate 1 and wiring board 8 from both sides thereof to electrically join them, which completes the manufacture of the photovoltaic device 10 (see step (m) in FIG. 6).

The wiring board 8 is formed by depositing a metal such as copper across the entire surface of the insulating substrate 81 and etching out or otherwise removing parts of the deposited metal (i.e., patterning).

The photovoltaic device 10 includes the p-type diffusion layer 11 surrounding the n-type diffusion layers 12 on one of the surfaces of the semiconductor substrate 1. The p-type diffusion layer 11 includes a plurality of p-type diffusion layers spaced apart from each other in the y-axis direction.

The photovoltaic device 10 further includes the electrodes 40 and 50. The electrodes 40, disposed on the p-type diffusion layers 11, extend along the x-axis direction, which is the lengthwise direction of the electrodes 40. The electrodes 50, disposed on the n-type diffusion layers 12, extend along the x-axis direction, which is the lengthwise direction of the electrodes 50.

The photovoltaic device 10 further includes the electrodes 6 disposed between the ends of the n-type diffusion layers 12 with respect to the x-axis direction and the edges of the semiconductor substrate 1 with respect to the x-axis direction.

The photovoltaic device 10 further includes the non-connecting regions 15 and 16. The non-connecting regions 15, disposed between those electrodes 4 which are adjacent in the y-axis direction, inhibit electrical connection to the electrodes 5. The non-connecting regions 16, disposed between those electrodes 5 which are adjacent in the y-axis direction, inhibit electrical connection to the electrodes 4.

The wiring board 8 includes the wires 82 and 83 extending in the y-axis direction. The wires 82 are connected electrically to the electrodes 4 and 6. The wires 83 are connected electrically to the electrodes 5.

The electrodes 4 extend in the x-axis direction beyond the ends of the electrodes 5 toward the edges of the semiconductor substrate 1. The electrodes 6 are disposed in line with the electrodes 5 with respect to the x-axis direction between those electrodes 4 which are adjacent in the y-axis direction. The electrodes 6 are connected electrically to the wires 82.

The electrodes 4 do not constitute a continuous body surrounding the electrodes 5. The electrodes 4 include the electrodes 50 arranged in the x-axis direction. This structure is unlikely to suffer from adverse effects of broken wires and other defects that may occur in patterning. The electrodes 50 have a simple shape, which facilitates the fabrication of the patterning mask.

The electrodes 4 extend toward the edges of the semiconductor substrate 1, thereby enabling collection of more of the carriers generated near the edges. This structure is unlikely to suffer from adverse effects of shape variations near the edges of the semiconductor substrate than a structure where the electrodes 4 constitute a continuous body surrounding the electrodes 5 near the edges of the semiconductor substrate. The structure therefore facilitates the designing of the patterning mask and aligning in the patterning process, which reduces patterning defects.

Since the electrodes 6 are provided between those electrodes 4 which are adjacent in the y-axis direction, more of the carriers generated in these regions can also be collected. The provision of the independent electrodes 6 further increases shape stability in patterning and also increases ease of aligning. Carriers can be well collected even in the presence of small variations in the shape of the electrodes 6.

If electrodes and wires are provided parallel to each other, it is relatively difficult to connect the electrodes 6 to the wires 82 without touching the electrodes 5. However, the electrodes 6 can be connected to the wires 82 by providing the wires 82 extending lengthwise in the y-axis direction and providing the independent electrodes 6 between the electrodes 4. In this structure, the electrodes 6 can be well connected to the wires 82, especially near the edges of the semiconductor substrate 1. The structure therefore imparts stable properties to the photovoltaic device 10 and improves the manufacturing yield of the photovoltaic device 10. In addition, the structure alleviates deterioration of the properties of the photovoltaic device 10 that may occur in long-term use, thereby improving its reliability.

The semiconductor substrate 1 has been described so far as being built around a n-type monocrystalline silicon substrate. Alternatively, in Embodiment 1, the semiconductor substrate 1 may be built around any of a n-type polycrystalline silicon substrate, a p-type monocrystalline silicon substrate, and a p-type polycrystalline silicon substrate.

If the semiconductor substrate 1 is built around a p-type monocrystalline silicon substrate or a p-type polycrystalline silicon substrate, the description above should be read simply with the p-type diffusion layer 11 and the n-type diffusion layers 12 being exchanged.

The electrodes 6 have been described so far as being disposed between the n-type diffusion layers 12 and the edges of the semiconductor substrate 1 on both ends of each n-type diffusion layer 12 with respect to the x-axis direction. Alternatively, in Embodiment 1, the electrodes 6 may be disposed between the n-type diffusion layers 12 and the edges of the semiconductor substrate 1 on at least one of the ends of each n-type diffusion layer 12 with respect to the x-axis direction.

The p-type diffusion layer 11 in the photovoltaic device 10 may include a plurality of p-type diffusion layers spaced apart from each other in the x-axis direction. The n-type diffusion layers 12 in the photovoltaic device 10 may include a plurality of n-type diffusion layers spaced apart from each other in the x-axis direction.

Embodiment 2

Figure 7A:
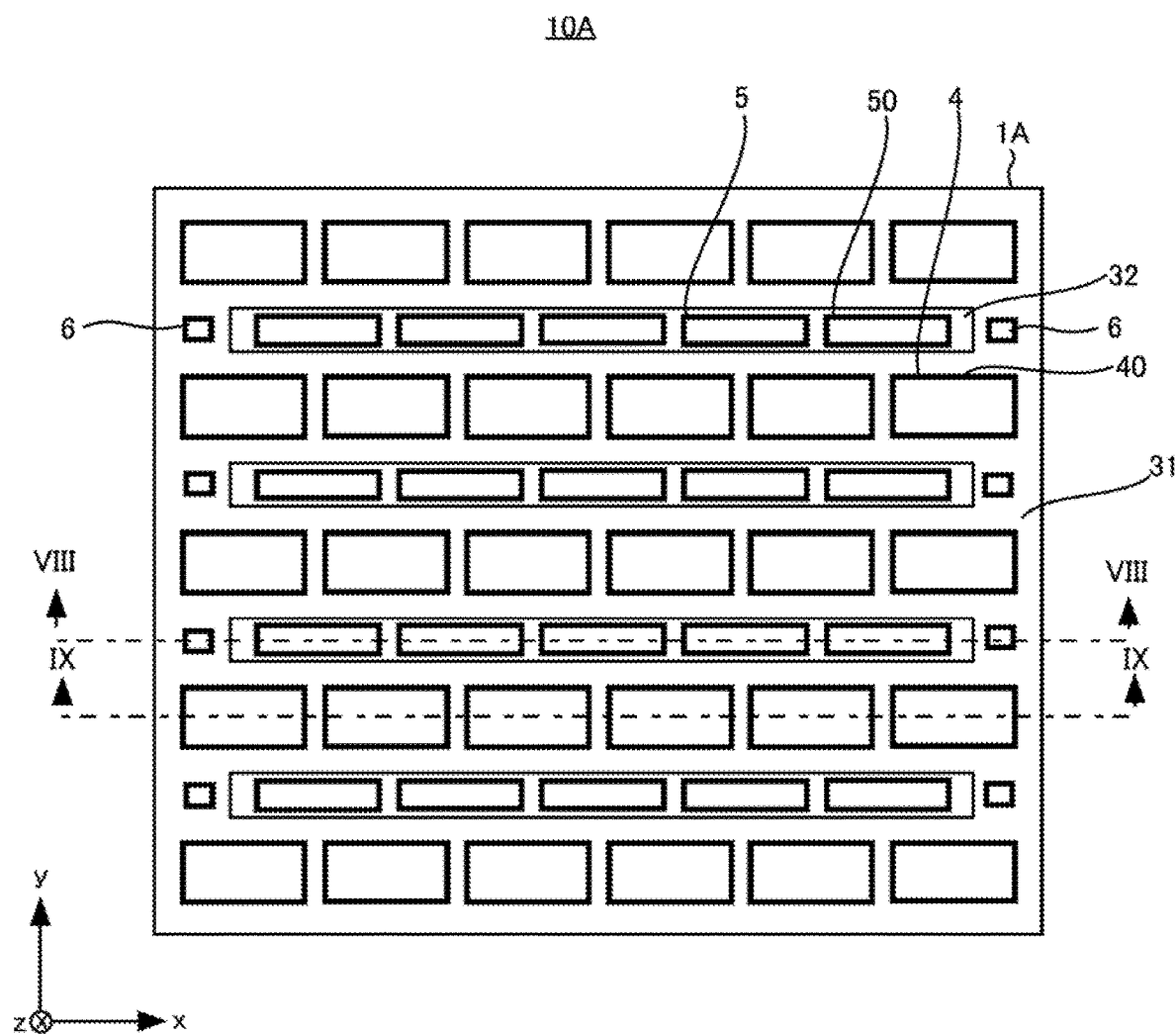
FIG. 7A is a first plan view of a photovoltaic device in accordance with Embodiment 2.
Figure 7B:
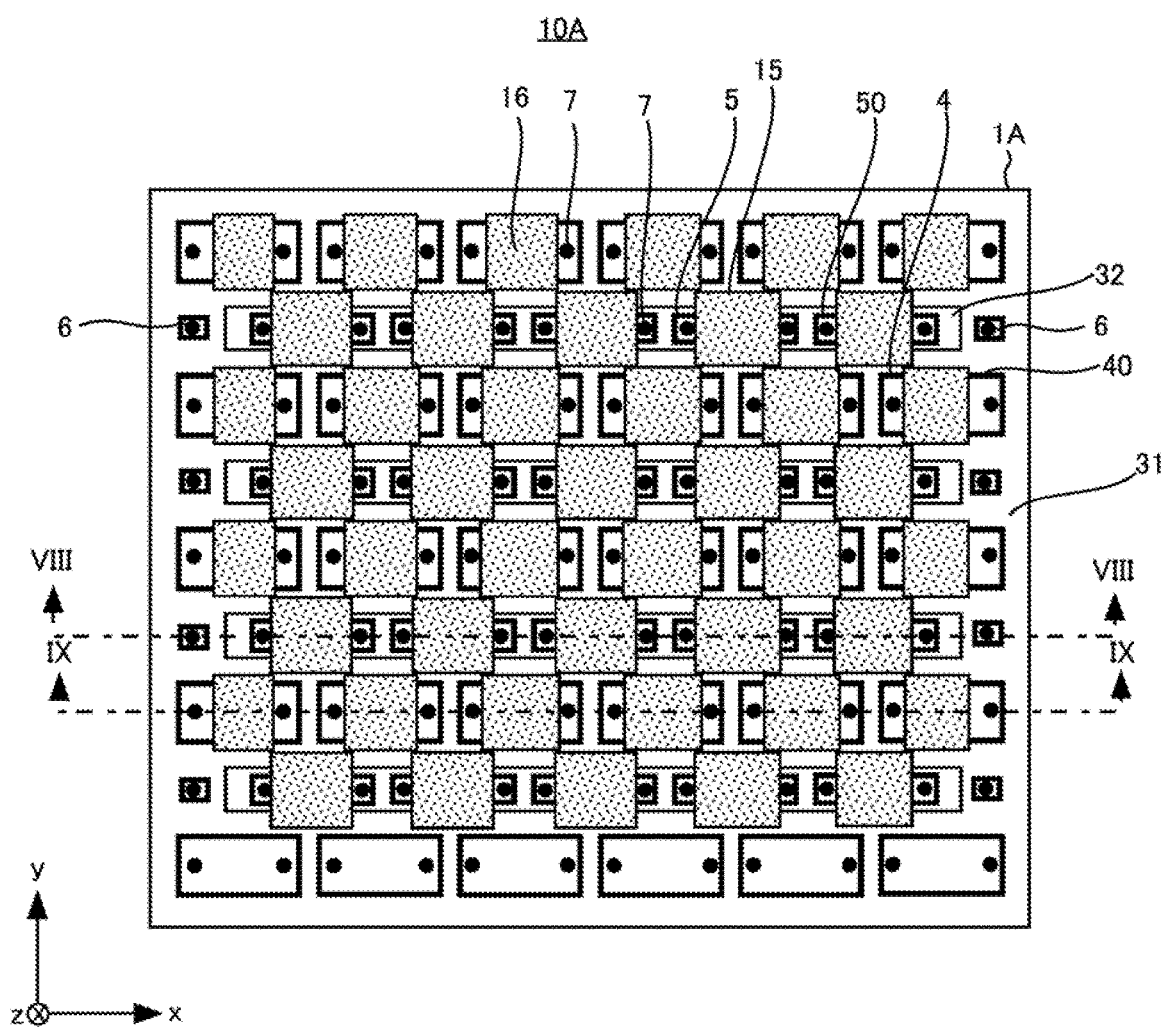
FIG. 7B is a second plan view of the photovoltaic device in accordance with Embodiment 2.
Figure 7C:
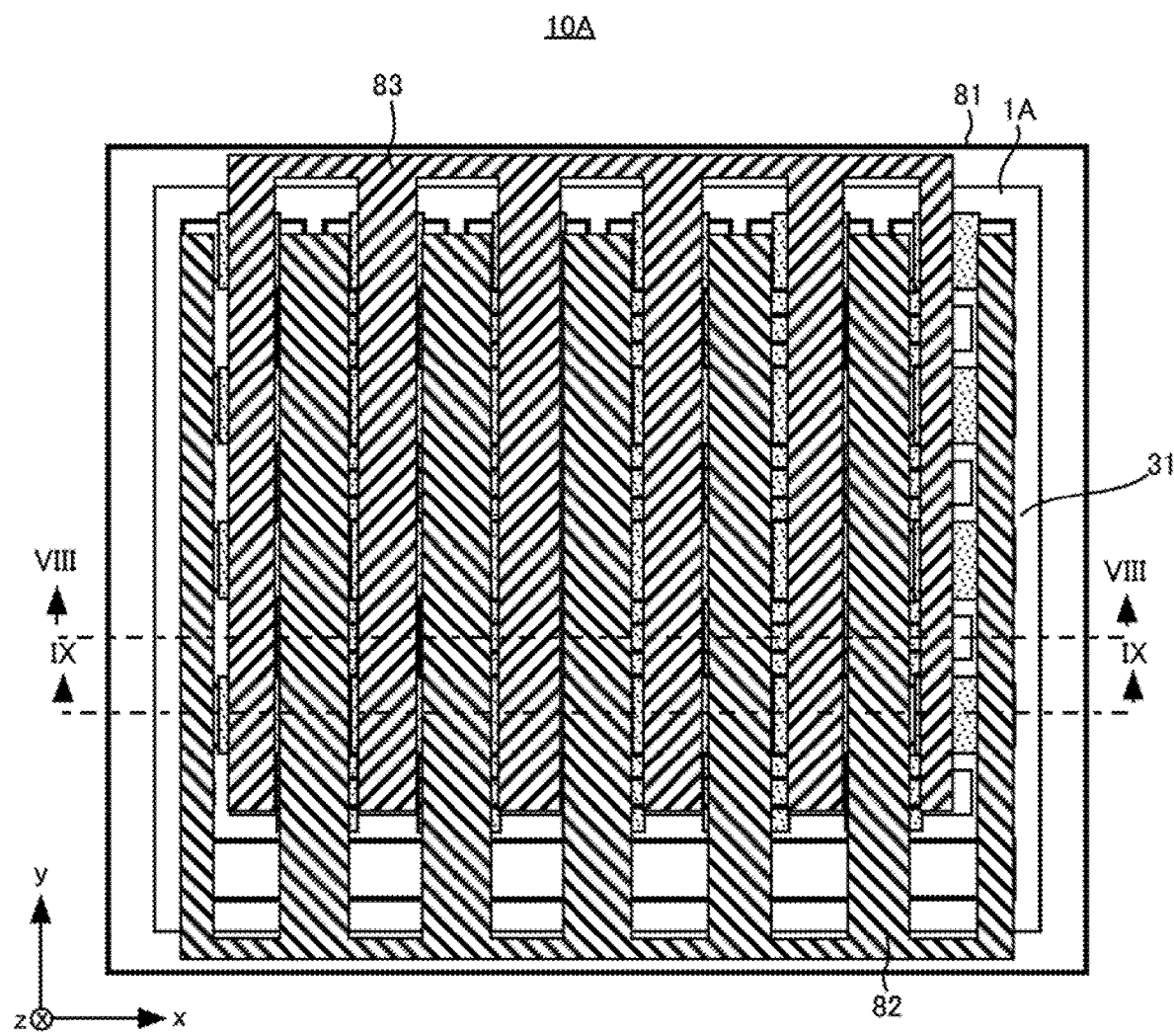
FIG. 7C is a third plan view of the photovoltaic device in accordance with Embodiment 2.
Figure 8:
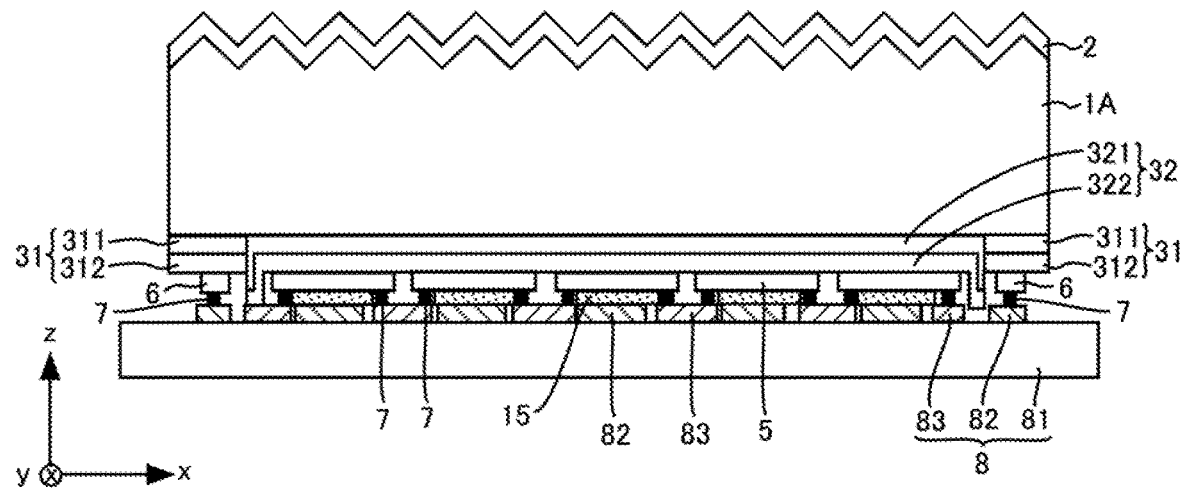
FIG. 8 is a cross-sectional view of the photovoltaic device, taken along line VIII-VIII in FIGS. 7A to 7C.
Figure 9:
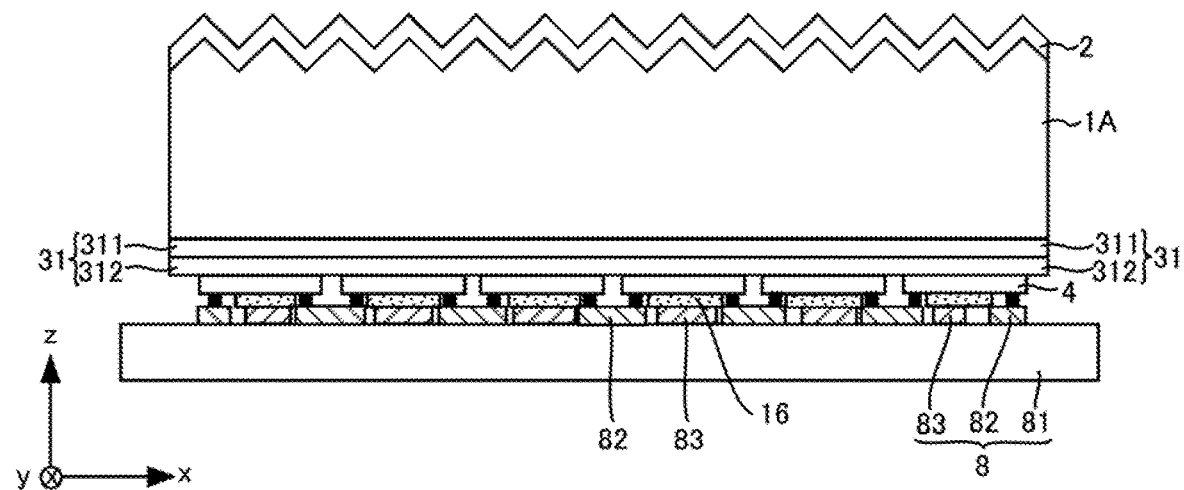
FIG. 9 is a cross-sectional view of the photovoltaic device, taken along line IX-IX in FIGS. 7A to 7C.

FIGS. 7A to 7C are first to third plan views, respectively, of a photovoltaic device in accordance with Embodiment 2. FIG. 8 is a cross-sectional view of the photovoltaic device, taken along line VIII-VIII in FIGS. 7A to 7C. FIG. 9 is a cross-sectional view of the photovoltaic device, taken along line IX-IX in FIGS. 7A to 7C. FIG. 7A shows, in plan view, first amorphous semiconductor layers, second amorphous semiconductor layers, and electrodes of the photovoltaic device as viewed from a side opposite a light-incident side thereof. FIG. 7B shows, in plan view, conductive adhesive layers and non-connecting regions of the photovoltaic device as viewed from the side opposite the light-incident side. FIG. 7C shows, in plan view, wires and an insulating substrate of the photovoltaic device as viewed from the side opposite the light-incident side. FIG. 7C depicts the insulating substrate 81 as being transparent, so that the wires can be visible. FIGS. 7A to 7C, 8, and 9 define x-, y-, and z-axes as indicated therein.

Referring to FIGS. 7A to 7C, 8, and 9, a photovoltaic device 10A in accordance with Embodiment 2 includes a semiconductor substrate 1A in place of the semiconductor substrate 1 of the photovoltaic device 10 shown in FIGS. 1A to 1C, 2, and 3 and a plurality of first amorphous semiconductor layers 31 and a plurality of second amorphous semiconductor layers 32 in place of the passivation film 3. Otherwise, the photovoltaic device 10A has the same structure as the photovoltaic device 10.

The semiconductor substrate 1A is built around, for example, a n-type monocrystalline silicon substrate and has a thickness of 100 to 200 μm. As an example, the semiconductor substrate 1A has a (100) crystal orientation and a specific resistance of 1 to 10 Ωcm. The semiconductor substrate 1A has texture on a light-incident-side surface thereof.

The first amorphous semiconductor layers 31 are spaced apart from each other on a surface opposite the light-incident-side surface of the semiconductor substrate 1A. The first amorphous semiconductor layers 31 are arranged so as to surround the second amorphous semiconductor layers 32 in the x-y plane. Each first amorphous semiconductor layer 31 includes an i-type amorphous semiconductor layer 311 and a p-type amorphous semiconductor layer 312.

The i-type amorphous semiconductor layer 311 is disposed on the semiconductor substrate 1A in contact with the semiconductor substrate 1A. The i-type amorphous semiconductor layer 311 is composed of, for example, i-type amorphous silicon, i-type amorphous silicon carbide, i-type amorphous silicon nitride, i-type amorphous silicon oxide, or i-type amorphous silicon nitride oxide. The i-type amorphous semiconductor layer 311 has a thickness of, for example, 5 to 30 nm.

The "i-type" semiconductor does not only refer to a completely intrinsic semiconductor, but also encompasses semiconductors contaminated with a n- or p-type impurity of sufficiently low concentration (both the n-type impurity concentration and the p-type impurity concentration are lower than $1\times10^{15}$ atoms/cm$^3$).

The "amorphous silicon," throughout the embodiments of the present invention, does not only refer to amorphous silicon containing silicon atoms with a dangling bond (i.e., an unhydrogenated end), but also encompasses hydrogenated amorphous silicon and other like silicon containing no atoms with a dangling bond.

The p-type amorphous semiconductor layer 312 is disposed on the i-type amorphous semiconductor layer 311 in contact with the i-type amorphous semiconductor layer 311. The p-type amorphous semiconductor layer 312 is composed of, for example, p-type amorphous silicon, p-type amorphous silicon carbide, p-type amorphous silicon nitride, p-type amorphous silicon oxide, or p-type amorphous silicon nitride oxide. The p-type amorphous semiconductor layer 312 has a thickness of, for example, 5 to 30 nm.

The p-type amorphous semiconductor layer 312 may contain, for example, boron (B) as a p-type impurity. The "p-type" semiconductor, throughout the embodiments of the present invention, has a p-type impurity concentration of at least $1\times10^{15}$ atoms/cm$^3$.

The second amorphous semiconductor layers 32 are disposed on the surface opposite the light-incident-side surface of the semiconductor substrate 1A and arranged alternately with the first amorphous semiconductor layers 31 when viewed along the width of the first amorphous semiconductor layers 31 (i.e., along the y-axis direction). Each second amorphous semiconductor layer 32 includes an i-type amorphous semiconductor layer 321 and a n-type amorphous semiconductor layer 322.

The i-type amorphous semiconductor layer 321 is disposed on the semiconductor substrate 1A in contact with the semiconductor substrate 1A. The i-type amorphous semiconductor layer 321 is composed of, for example, i-type amorphous silicon, i-type amorphous silicon carbide, i-type amorphous silicon nitride, i-type amorphous silicon oxide, or i-type amorphous silicon nitride oxide. The i-type amorphous semiconductor layer 321 has a thickness of, for example, 5 to 30 nm.

The n-type amorphous semiconductor layer 322 is disposed on the i-type amorphous semiconductor layer 321 in contact with the i-type amorphous semiconductor layer 321. The n-type amorphous semiconductor layer 322 is composed of, for example, n-type amorphous silicon, n-type amorphous silicon carbide, n-type amorphous silicon nitride, n-type amorphous silicon oxide, or n-type amorphous silicon nitride oxide. The n-type amorphous semiconductor layer 322 has a thickness of, for example, 5 to 30 nm.

The n-type amorphous semiconductor layer 322 may contain, for example, phosphorus (P) as a n-type impurity. The "n-type" semiconductor, throughout the embodiments of the present invention, has a n-type impurity concentration of at least $1 \times 10^{15}$ atoms/cm$^3$.

The electrodes 4, 5, and 6 may be provided, and the wiring board 8 may be connected, in the same manner as in Embodiment 1.

Figure 10:
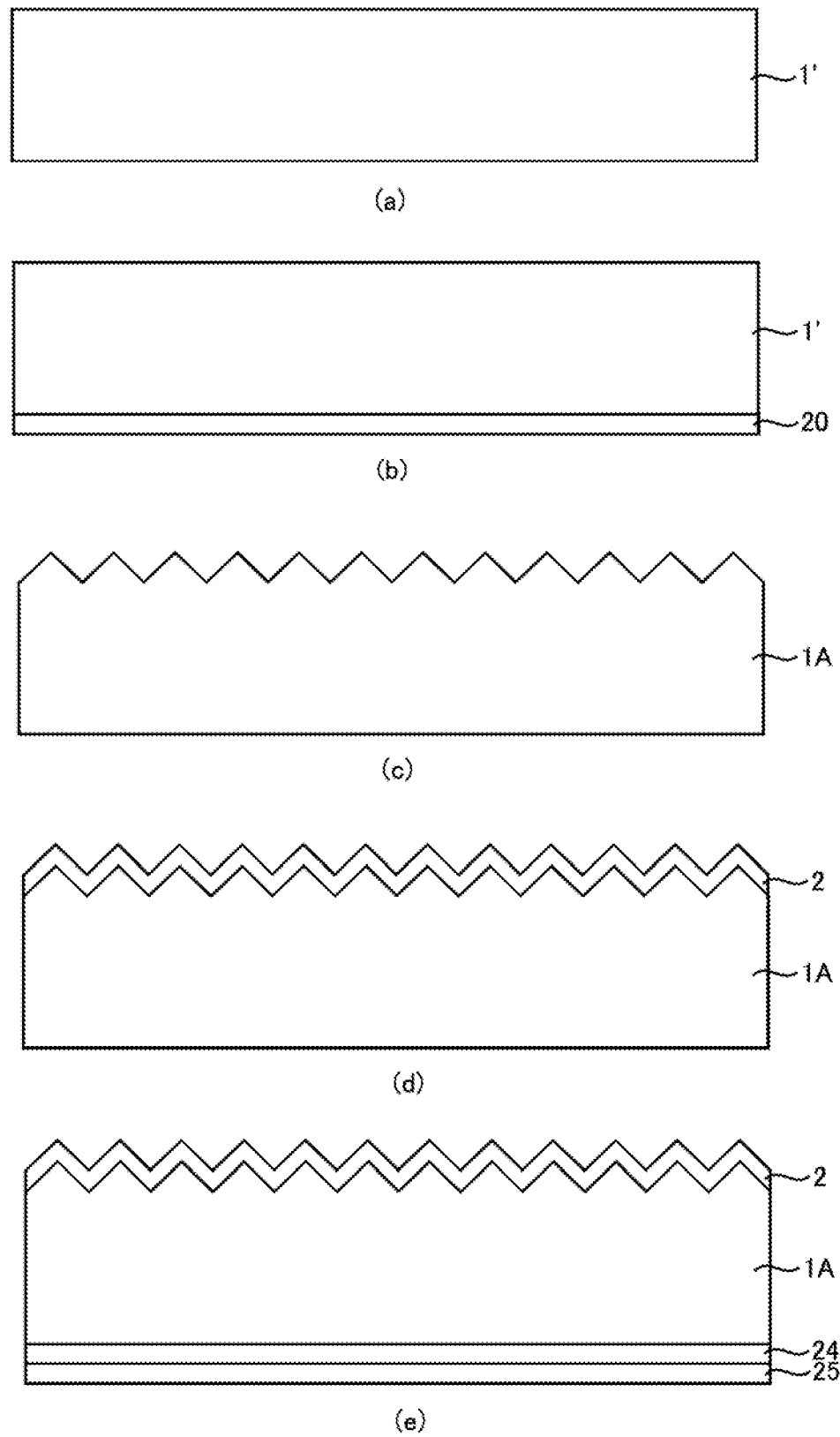
FIG. 10 is a first manufacturing step diagram illustrating manufacturing steps for the photovoltaic device shown in FIGS. 7A to 7C, 8, and 9.
Figure 11:
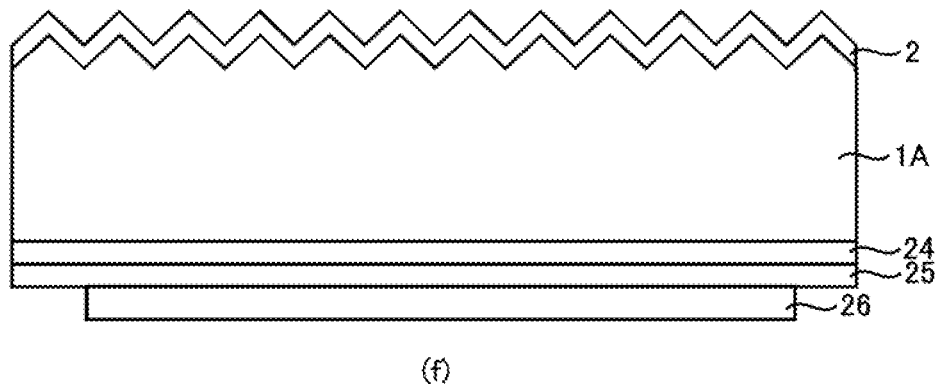
FIG. 11 is a second manufacturing step diagram illustrating manufacturing steps for the photovoltaic device shown in FIGS. 7A to 7C, 8, and 9.
Figure 11:
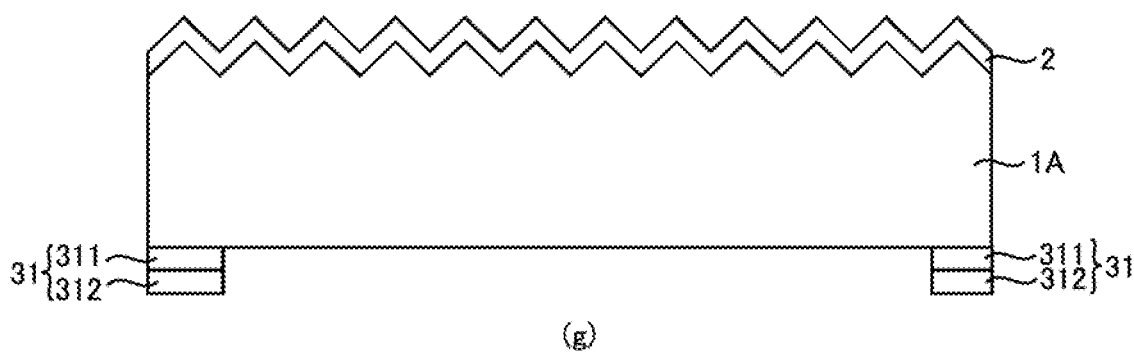
Figure 11:
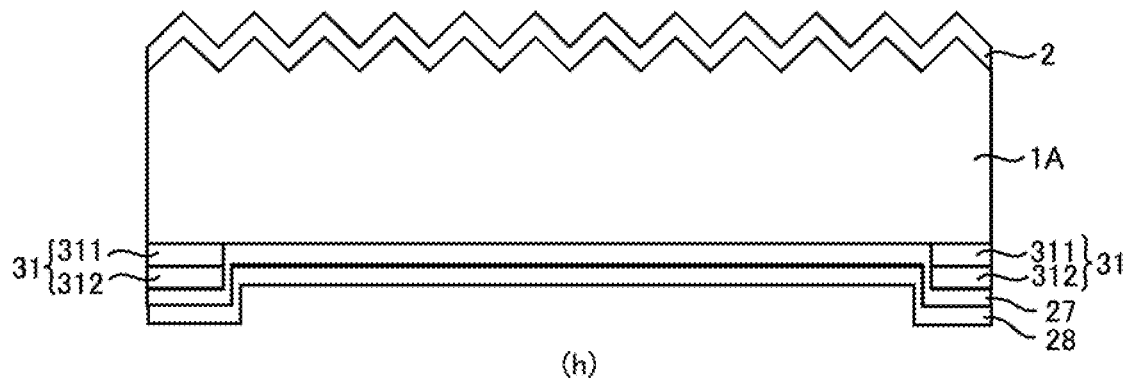
Figure 11:
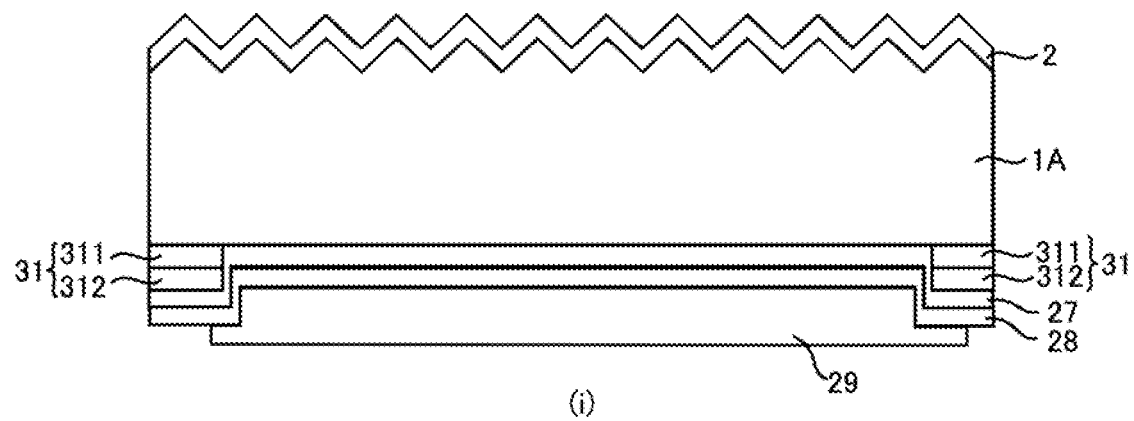
Figure 12:
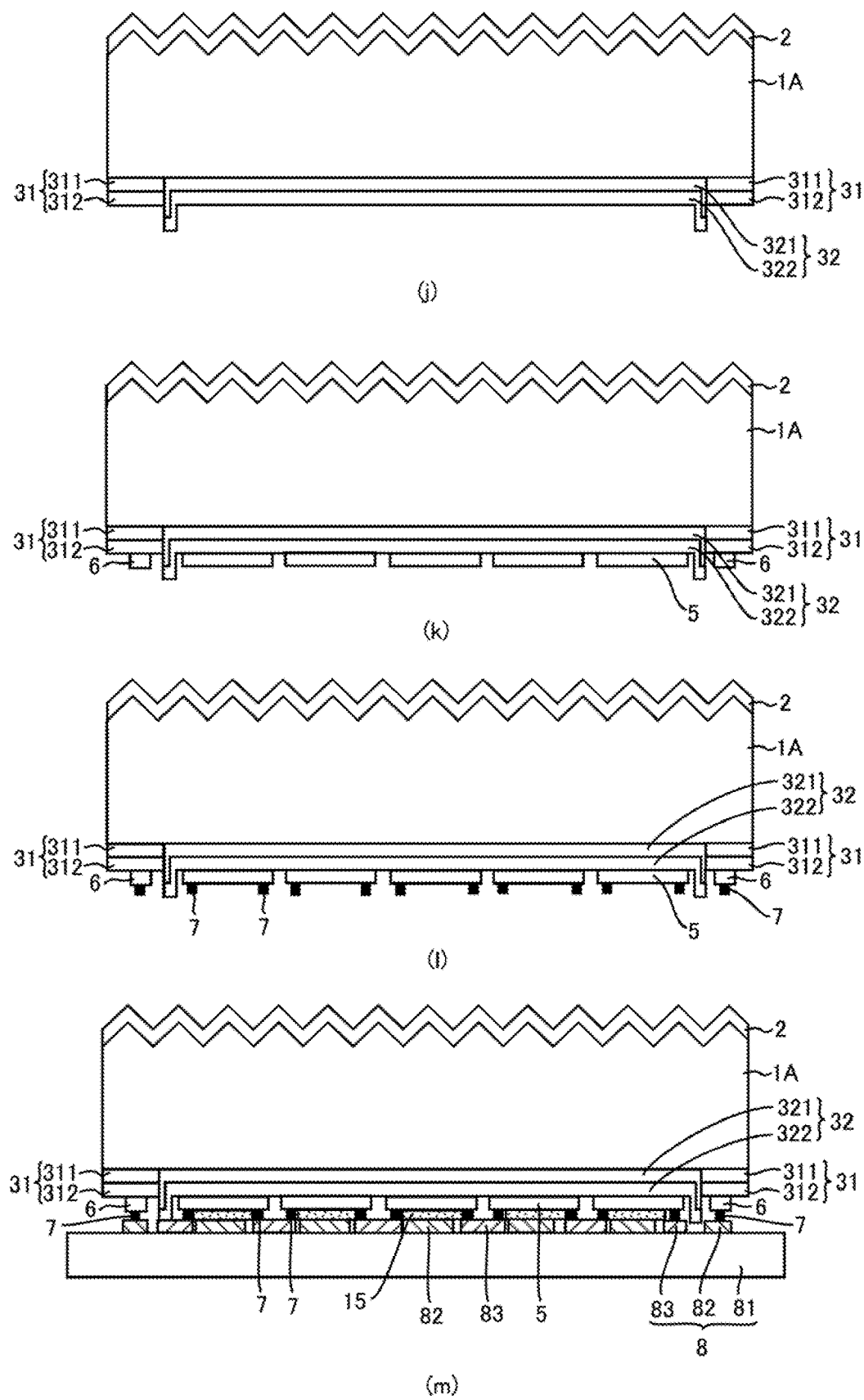
FIG. 12 a third manufacturing step diagram illustrating manufacturing steps for the photovoltaic device shown in FIGS. 7A to 7C, 8, and 9.

FIGS. 10 to 12 are first to third manufacturing step diagrams, respectively, illustrating manufacturing steps for the photovoltaic device 10A shown in FIGS. 7A to 7C, 8, and 9. The manufacturing step diagrams in FIGS. 10 to 12 are drawn based on the cross-sectional views taken along line VIII-VIII in FIGS. 7A to 7C.

Referring to FIG. 10, the same steps as steps (a) to (d) shown in FIG. 4 are sequentially carried out at the start of the manufacture of the photovoltaic device 10A. The semiconductor substrate 1A is thus obtained (see step (c) in FIG. 10), and the antireflective film 2 is formed on the light-incident-side surface of the semiconductor substrate 1A (see step (d) in FIG. 10).

Following step (d), an i-type amorphous semiconductor layer 24 and a p-type amorphous semiconductor layer 25 are sequentially formed on a surface of the semiconductor substrate 1A that is opposite the surface thereof carrying texture thereon (see step (e) in FIG. 10). The i-type amorphous semiconductor layer 24 and the p-type amorphous semiconductor layer 25 may be formed by plasma CVD (chemical vapor deposition) or any other method.

Conditions are publicly known for forming the i-type amorphous semiconductor layer 24 by plasma CVD from, for example, i-type amorphous silicon, i-type amorphous silicon carbide, i-type amorphous silicon nitride, i-type amorphous silicon oxide, or i-type amorphous silicon nitride oxide. These publicly known conditions may be used to form the i-type amorphous semiconductor layer 24.

Conditions are also publicly known for forming the p-type amorphous semiconductor layer 25 by plasma CVD from, for example, p-type amorphous silicon, p-type amorphous silicon carbide, p-type amorphous silicon nitride, p-type amorphous silicon oxide, or p-type amorphous silicon nitride oxide. These publicly known conditions may be used to form the p-type amorphous semiconductor layer 25.

Following step (e), an etching paste 26 is applied onto the p-type amorphous semiconductor layer 25 (see step (f) in FIG. 11). The etching paste 26 may be any substance that enables etching of a laminate of the i-type amorphous semiconductor layer 24 and the p-type amorphous semiconductor layer 25.

Next, parts of the laminate of the i-type amorphous semiconductor layer 24 and the p-type amorphous semiconductor layer 25 are etched out in the thickness direction thereof by heating the etching paste 26 (see step (g) in FIG. 11). This step exposes parts of the back face of the semiconductor substrate 1A (the surface opposite the surface carrying the texture thereon). The first amorphous semiconductor layers 31 are formed, each including an i-type amorphous semiconductor layer 311 and a p-type amorphous semiconductor layer 312.

An i-type amorphous semiconductor layer 27 is then formed in contact with the exposed surface on the backside of the semiconductor substrate 1A and in contact with the p-type amorphous semiconductor layer 312. Thereafter, a n-type amorphous semiconductor layer 28 is formed in contact with the entire surface of the i-type amorphous semiconductor layer 27 (see step (h) in FIG. 11). The i-type amorphous semiconductor layer 27 and the n-type amorphous semiconductor layer 28 may be formed, for example, by plasma CVD or any other method.

Conditions are publicly known for forming the i-type amorphous semiconductor layer 27 by plasma CVD from, for example, i-type amorphous silicon, i-type amorphous silicon carbide, i-type amorphous silicon nitride, i-type amorphous silicon oxide, or i-type amorphous silicon nitride oxide. These publicly known conditions may be used to form the i-type amorphous semiconductor layer 27.

Conditions are also publicly known for forming the n-type amorphous semiconductor layer 28 by plasma CVD from, for example, n-type amorphous silicon, n-type amorphous silicon carbide, n-type amorphous silicon nitride, n-type amorphous silicon oxide, or n-type amorphous silicon nitride oxide. These publicly known conditions may be used to form the n-type amorphous semiconductor layer 28.

Following step (h), an etching mask 29 is formed on the n-type amorphous semiconductor layer 28 (see step (i) in FIG. 11). The etching mask 29 may be anything that is capable of serving as a mask in etching a laminate of the i-type amorphous semiconductor layer 27 and the n-type amorphous semiconductor layer 28.

Next, parts of the laminate of the i-type amorphous semiconductor layer 27 and the n-type amorphous semiconductor layer 28 are etched out in the thickness direction thereof by using the etching mask 29 as a mask. The etching mask 29 is then removed. This step exposes parts of the surface of the p-type amorphous semiconductor layer 312 (see step (j) in FIG. 12). The second amorphous semiconductor layers 32 are formed, each including an i-type amorphous semiconductor layer 321 and a n-type amorphous semiconductor layer 322.

Then, the electrodes 6 are formed on the p-type amorphous semiconductor layer 312, and the electrodes 5 are formed on the n-type amorphous semiconductor layer 322 (see step (k) in FIG. 12). The electrodes 4 (not shown in step (k)) are formed on the p-type amorphous semiconductor layer 312 simultaneously with the electrodes 5 and 6. The electrodes 4 to 6 may be formed by sputtering or vapor deposition using a metal or other mask. The metal mask has openings at those sites where electrodes are to be formed. The openings preferably have a rectangular or other simple shape because there are restrictions on, for example, the opening/non-opening ratio, minimum opening width, and shape that the openings are allowed to take, in order to maintain the mechanical strength of the metal mask. The mechanical strength is easier to maintain if the openings are arranged in a pattern than if the openings are irregularly located. The electrodes 4 to 6 formed in this manner may in some cases have a thickness that increases from the periphery toward the center, depending on the opening width and opening-forming conditions.

Following step (k), a low-melting-point solder paste is provided in the form of dots on the electrodes 4 to 6 by printing or a like technique in order to form the conductive adhesive layers 7 (see step (l) in FIG. 12).

Next, the insulating substrate 81 is prepared, which is approximately 150 μm. The semiconductor substrate 1A and the wiring board 8 are then attached together, with their positions adjusted in such a manner that the wires 82 and 83 will be substantially perpendicular to the electrodes 4 and 6 and the electrodes 5 respectively in order to establish electrical contacts in prescribed locations. Then, for example, pressure and heat are applied to the attached semiconductor substrate 1A and wiring board 8 from both sides thereof to electrically join them, which completes the manufacture of the photovoltaic device 10A (see step (m) in FIG. 12).

The photovoltaic device 10A can achieve the same advantages as the photovoltaic device 10 detailed earlier.

In the photovoltaic device 10A, the first amorphous semiconductor layers 31 may include a plurality of first amorphous semiconductor layers spaced apart from each other in the x-axis direction, and the second amorphous semiconductor layers 32 may include a plurality of second amorphous semiconductor layers spaced apart from each other in the x-axis direction.

The description of Embodiment 1 applies equally to Embodiment 2 unless otherwise mentioned explicitly.

Embodiment 3

Figure 13A:
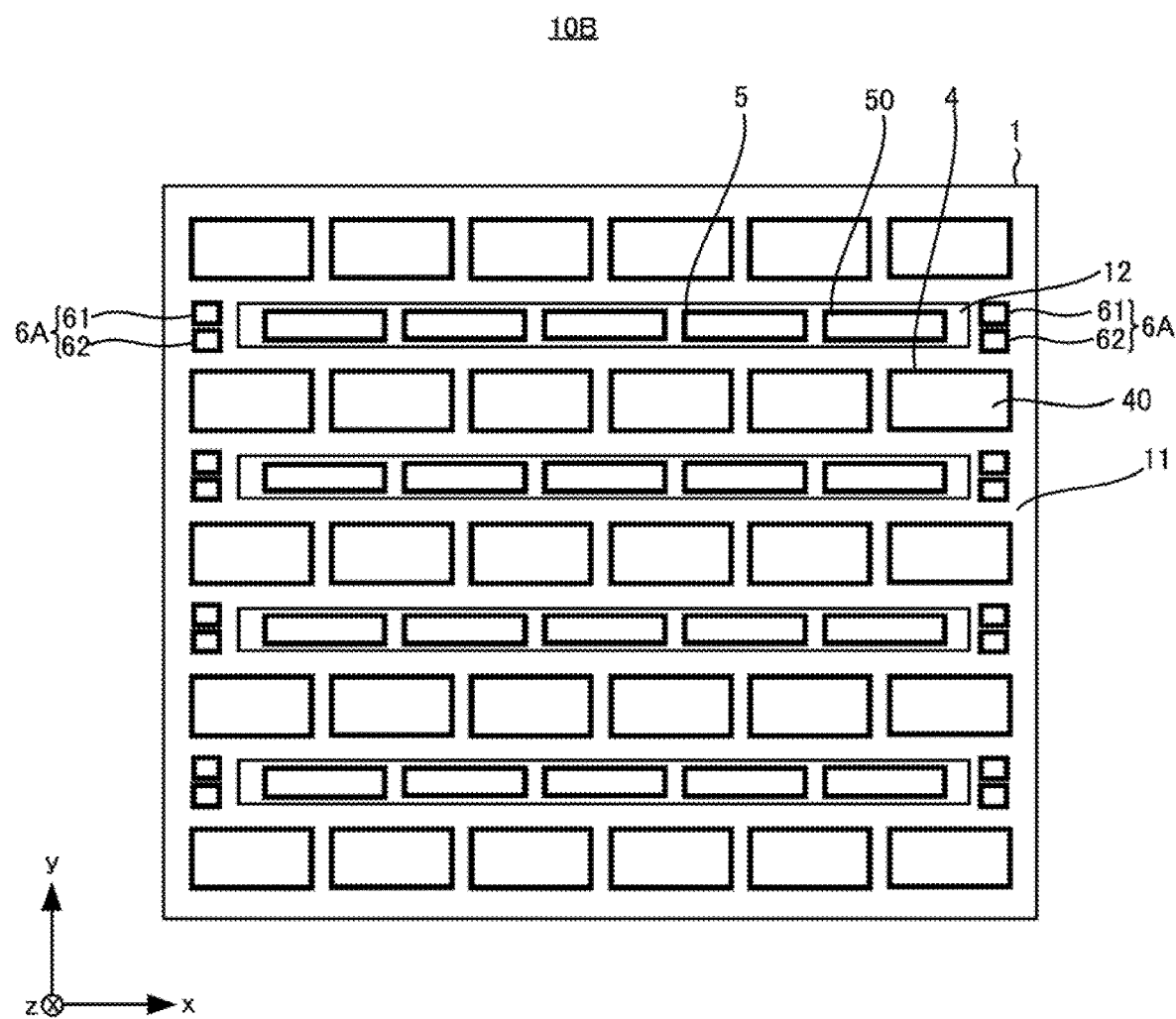
FIG. 13A is a first plan view of a photovoltaic device in accordance with Embodiment 3.
Figure 13B:
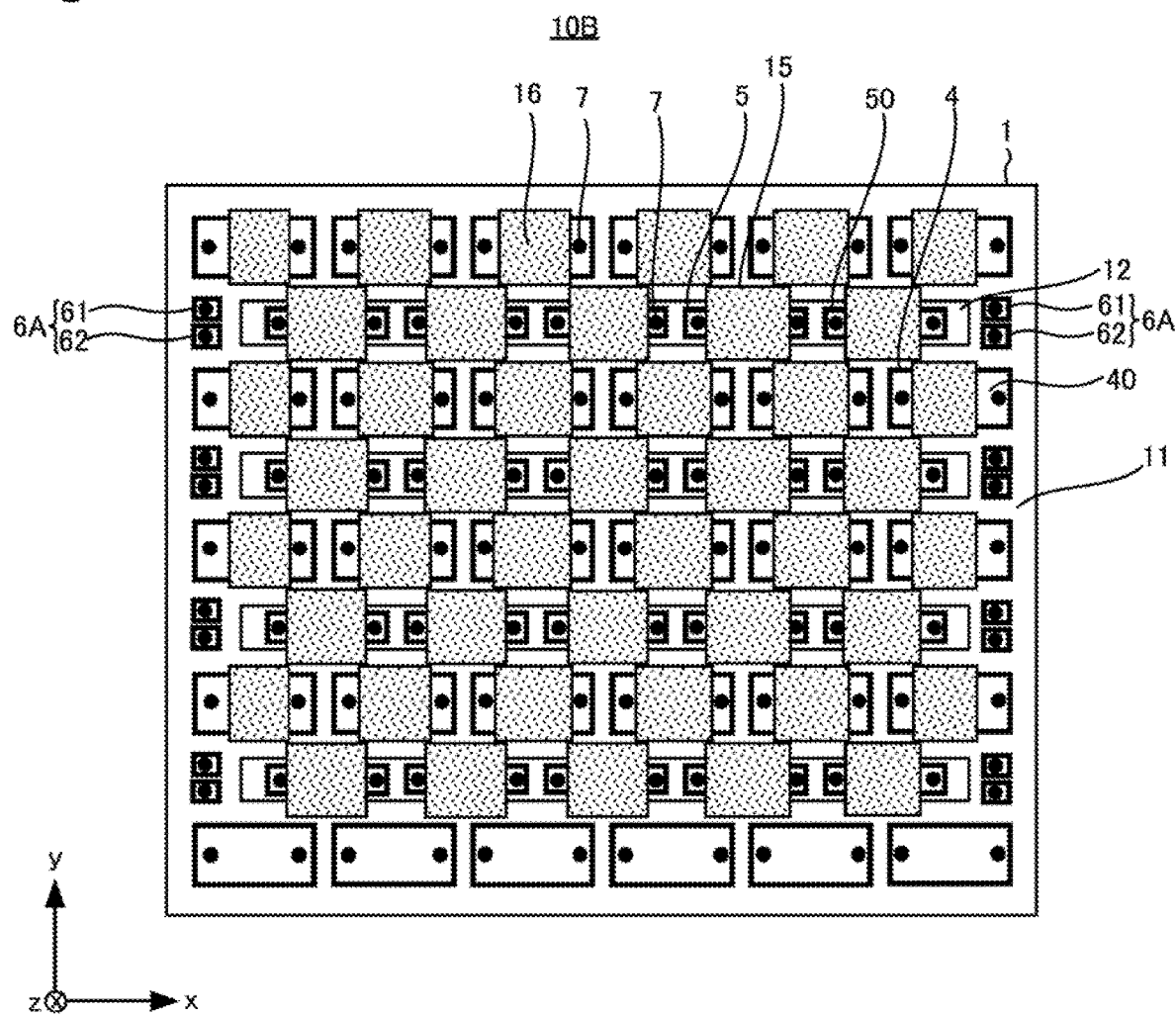
FIG. 13B is a second plan view of the photovoltaic device in accordance with Embodiment 3.
Figure 13C:
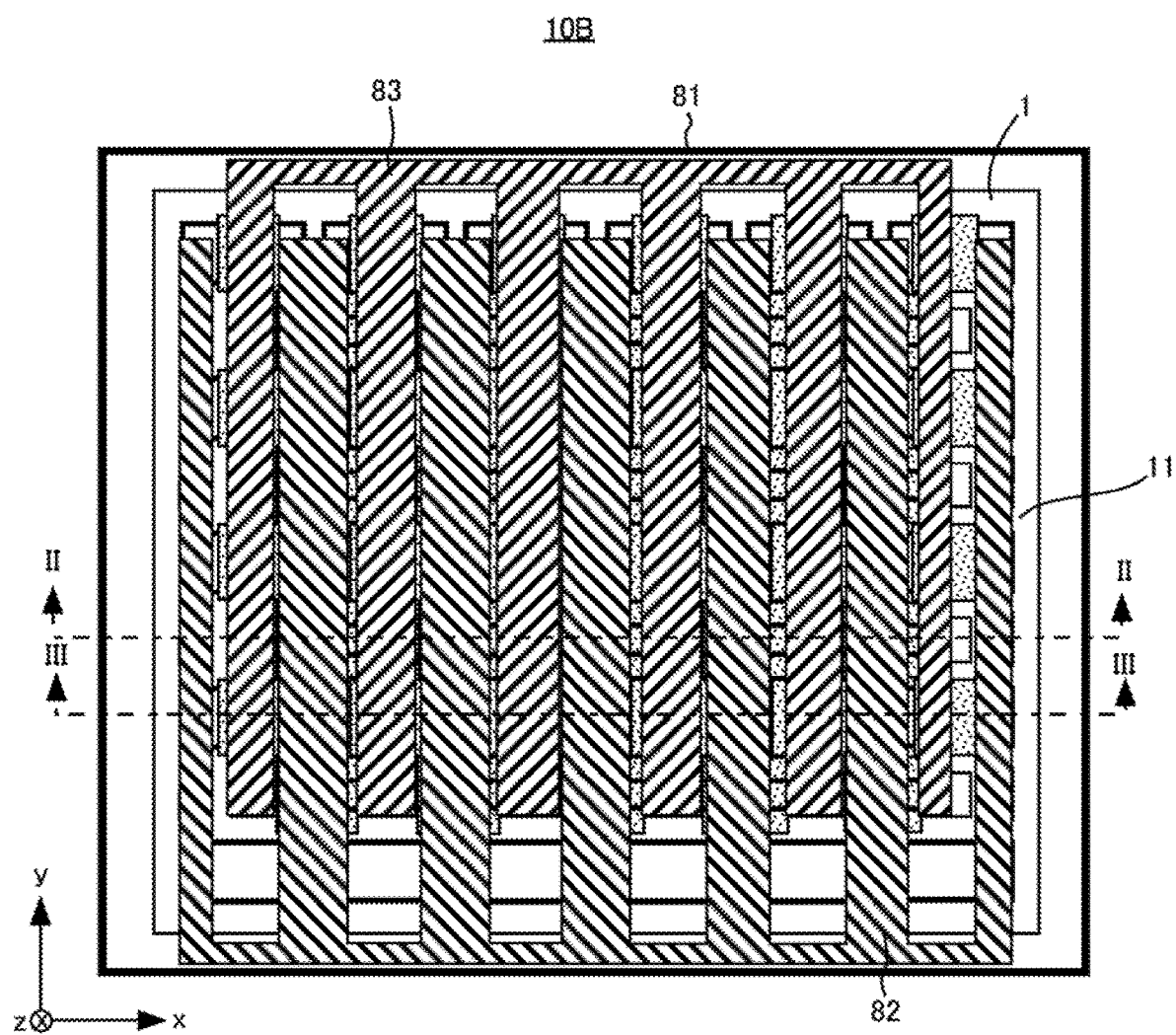
FIG. 13C is a third plan view of the photovoltaic device in accordance with Embodiment 3.

FIGS. 13A to 13C are first to third plan views, respectively, of a photovoltaic device in accordance with Embodiment 3. FIG. 13A shows, in plan view, a p-type diffusion layer, n-type diffusion layers, and electrodes of the photovoltaic device as viewed from a side opposite a light-incident side thereof. FIG. 13B shows, in plan view, conductive adhesive layers and non-connecting regions of the photovoltaic device as viewed from the side opposite the light-incident side. FIG. 13C shows, in plan view, wires and an insulating substrate of the photovoltaic device as viewed from the side opposite the light-incident side. FIG. 13C depicts the insulating substrate 81 as being transparent, so that the wires can be visible. FIGS. 13A to 13C define x-, y-, and z-axes as indicated therein.

Referring to FIGS. 13A to 13C, a photovoltaic device 10B in accordance with Embodiment 3 includes electrodes 6A in place of the electrodes 6 of the photovoltaic device 10 shown in FIGS. 1A to 1C, 2, and 3. Otherwise, the photovoltaic device 10B has the same structure as the photovoltaic device 10.

The electrodes 6A are disposed between the n-type diffusion layers 12 and the edges of the semiconductor substrate 1 on both ends of each n-type diffusion layer 12 with respect to the x-axis direction. Preferably, the electrodes 6A are disposed in line with the n-type diffusion layers 12 with respect to the x-axis direction.

The electrodes 6A include electrodes 61 and 62. The electrodes 61 and 62 have the same size and thickness as the electrodes 6 and are composed of the same material as the electrodes 6.

The electrodes 61 and 62 are connected to the wires 82 by the conductive adhesive layers 7.

Each electrode 6A in the photovoltaic device 10B, including two electrodes 61 and 62, is disposed between those electrodes 4 which are adjacent in the y-axis direction. Therefore, the electrodes 6A collect more carriers near the edges of the semiconductor substrate 1. As a result, the photovoltaic device 10B exhibits improved properties over the photovoltaic device 10.

The photovoltaic device 10B is manufactured by steps (a) to (m) shown in FIGS. 4 to 6.

The photovoltaic device in accordance with Embodiment 3 encompasses a photovoltaic device obtained by modifying the photovoltaic device 10A shown in FIGS. 7A to 7C, 8, and 9 in the same manner as the photovoltaic device 10 is modified to obtain the photovoltaic device 10B.

The electrodes 6A have been described so far as being disposed between the n-type diffusion layers 12 and the edges of the semiconductor substrate 1 on both ends of each n-type diffusion layer 12 with respect to the x-axis direction. Alternatively, in Embodiment 3, the electrodes 6A may be disposed between the n-type diffusion layers 12 and the edges of the semiconductor substrate 1 on at least one of the ends of each n-type diffusion layer 12 with respect to the x-axis direction.

The description of Embodiments 1 and 2 applies equally to Embodiment 3 unless otherwise mentioned explicitly.

Embodiment 4

Figure 14A:
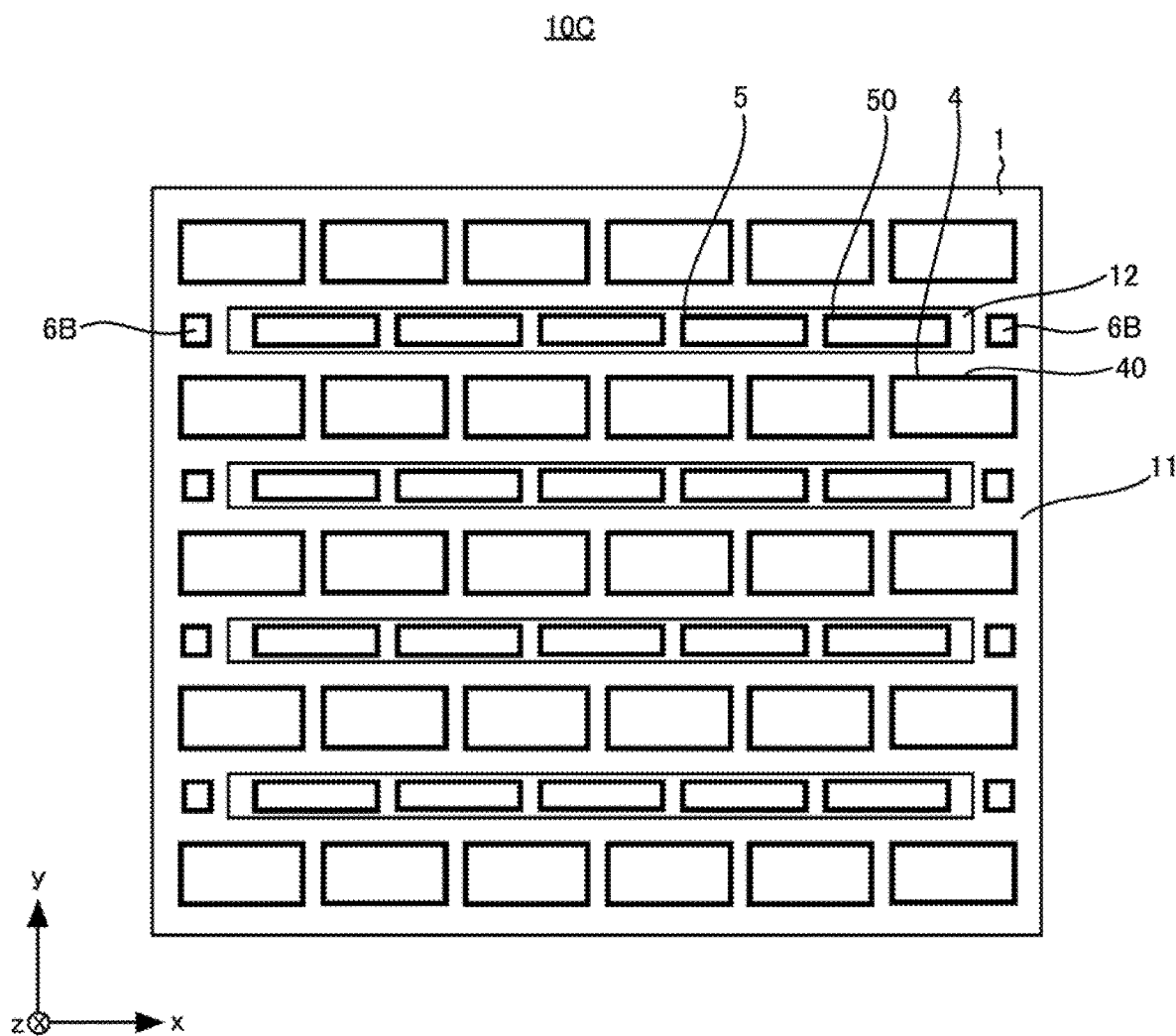
FIG. 14A is a first plan view of a photovoltaic device in accordance with Embodiment 4.
Figure 14B:
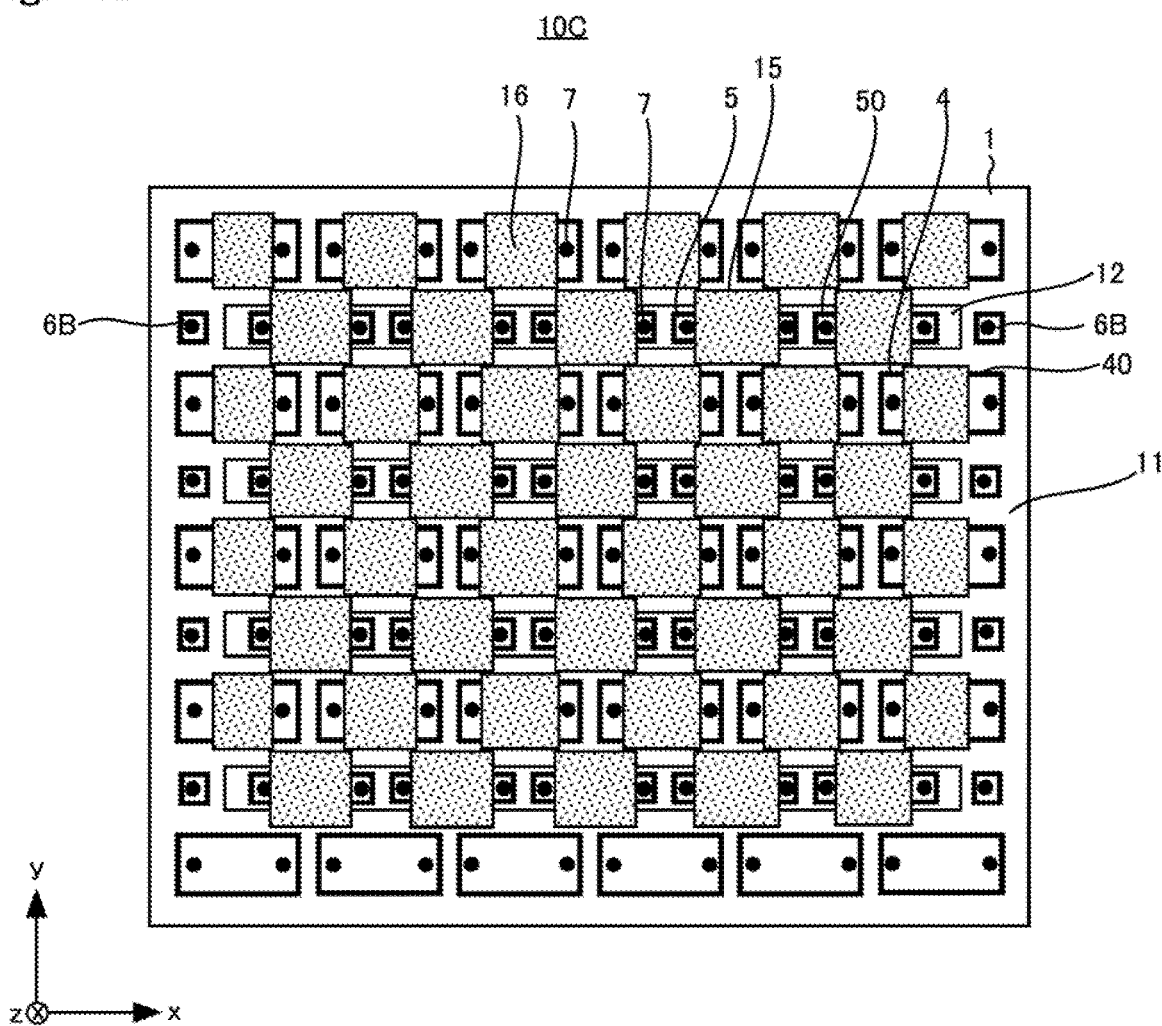
FIG. 14B is a second plan view of the photovoltaic device in accordance with Embodiment 4.
Figure 14C:
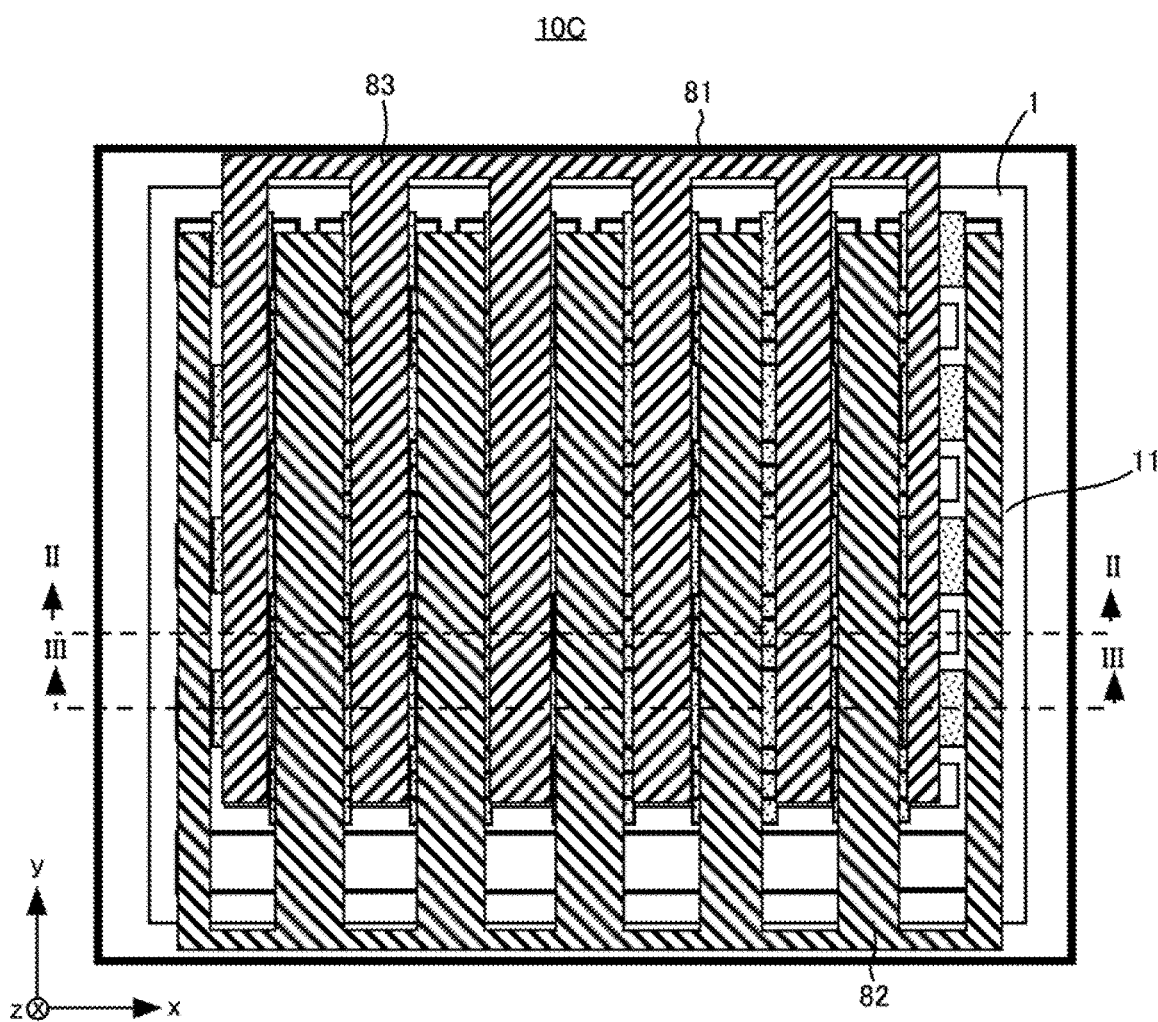
FIG. 14C is a third plan view of the photovoltaic device in accordance with Embodiment 4.

FIGS. 14A to 14C are first to third plan views, respectively, of a photovoltaic device in accordance with Embodiment 4. FIG. 14A shows, in plan view, a p-type diffusion layer, n-type diffusion layers, and electrodes of the photovoltaic device as viewed from a side opposite a light-incident side thereof. FIG. 14B shows, in plan view, conductive adhesive layers and non-connecting regions of the photovoltaic device as viewed from the side opposite the light-incident side. FIG. 14C shows, in plan view, wires and an insulating substrate of the photovoltaic device as viewed from the side opposite the light-incident side. FIG. 14C depicts the insulating substrate 81 as being transparent, so that the wires can be visible. FIGS. 14A to 14C define x-, y-, and z-axes as indicated therein.

Referring to FIGS. 14A to 14C, a photovoltaic device 10C in accordance with Embodiment 4 includes electrodes 6B in place of the electrodes 6 of the photovoltaic device 10 shown in FIGS. 1A to 1C, 2, and 3. Otherwise, the photovoltaic device 10C has the same structure as the photovoltaic device 10.

The electrodes 6B are disposed between the n-type diffusion layers 12 and the edges of the semiconductor substrate 1 on both ends of each n-type diffusion layer 12 with respect to the x-axis direction. Preferably, the electrodes 6B are disposed in line with the n-type diffusion layers 12 with respect to the x-axis direction.

The electrodes 6B have a y-axis-wise length (=width) that is greater than the width of the electrodes 6 and substantially equal to the width of the electrodes 5. In this context, the "width" of the electrodes 5, 6, and 6B refers to an approximate y-axis-wise length (width) of their major portions, and "the electrodes 6B having substantially the same width as the electrodes 5" means that the electrodes 5 and 6B appear to have the same width to the naked human eye. These arrangements, for example, alleviate restraints on the design of the mechanical strength of a metal mask used in the formation of electrodes. The arrangements thus lead to optimal design of the width, shape, and other properties of the electrodes.

The electrodes 6B have the same thickness as the electrodes 6 and are composed of the same material as the electrodes 6. The electrodes 6B are connected to the wires 82 by the conductive adhesive layers 7.

The electrodes 6B in the photovoltaic device 10C, being wider than the electrodes 6, are disposed between those electrodes 4 which are adjacent in the y-axis direction. Therefore, the electrodes 6B collect more carriers near the edges of the semiconductor substrate 1. As a result, the photovoltaic device 10C exhibits improved properties over the photovoltaic device 10.

The photovoltaic device 10C is manufactured by steps (a) to (m) shown in FIGS. 4 to 6.

The photovoltaic device in accordance with Embodiment 4 encompasses a photovoltaic device obtained by modifying the photovoltaic device 10A shown in FIGS. 7A to 7C, 8, and 9 in the same manner as the photovoltaic device 10 is modified to obtain the photovoltaic device 10C.

The electrodes 6B have been described so far as being disposed between the n-type diffusion layers 12 and the edges of the semiconductor substrate 1 on both ends of each n-type diffusion layer 12 with respect to the x-axis direction. Alternatively, in Embodiment 4, the electrodes 6B may be disposed between the n-type diffusion layers 12 and the edges of the semiconductor substrate 1 on at least one of the ends of each n-type diffusion layer 12 with respect to the x-axis direction.

The description of Embodiments 1 and 2 applies equally to Embodiment 4 unless otherwise mentioned explicitly.

Embodiment 5

Figure 15:
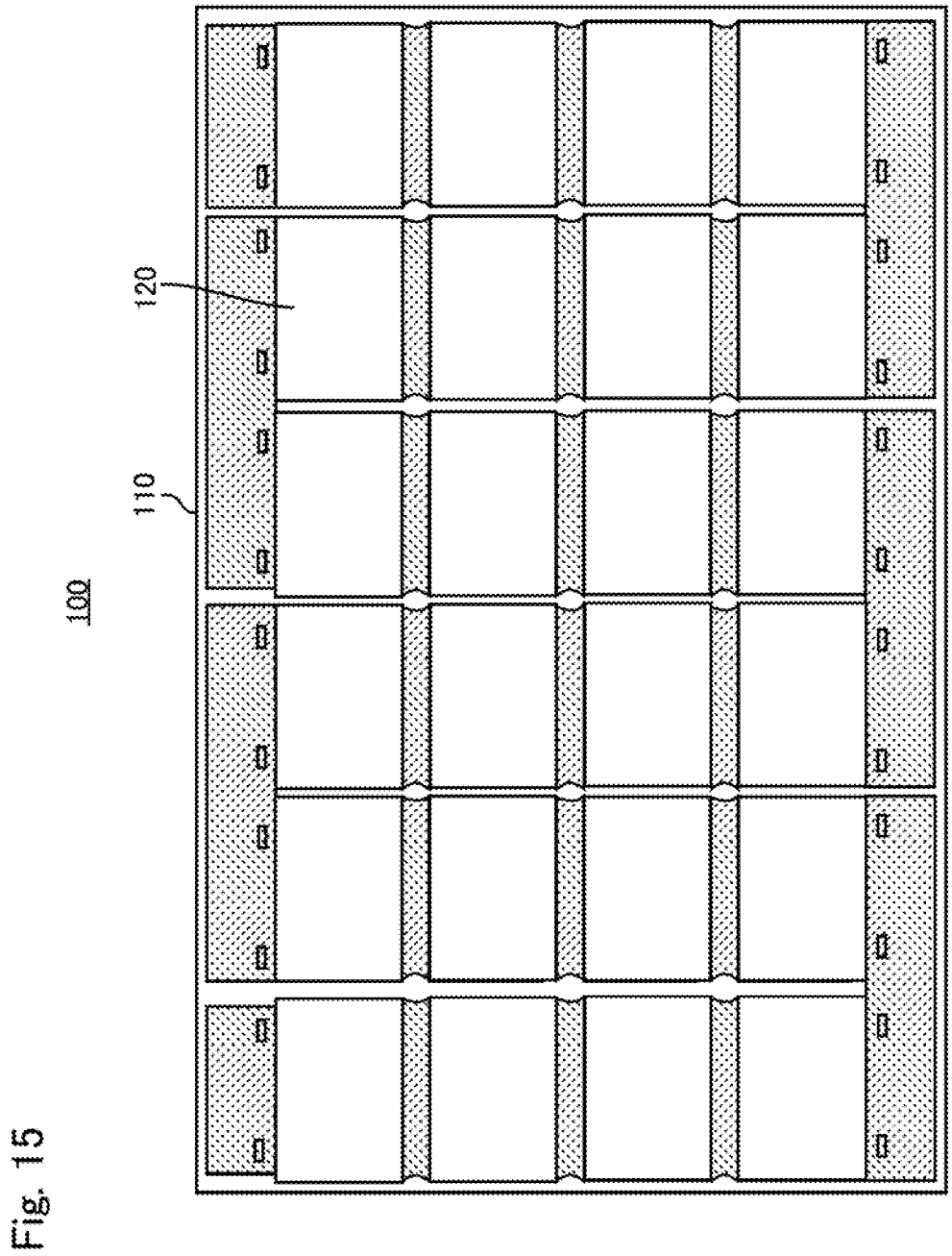
FIG. 15 is a plan view of a solar cell string in accordance with Embodiment 5.

FIG. 15 is a plan view of a solar cell string in accordance with Embodiment 5. FIG. 15 shows, in plan view, a solar cell string as viewed from a light-incident side.

Referring to FIG. 15, a solar cell string 100 in accordance with Embodiment 5 includes a wiring board 110 and a plurality of solar cells 120.

The solar cells 120 are arranged on the wiring board 110, for example, in a 4×6 matrix and electrically connected, for example, in series.

Each solar cell 120 either includes, among the members of the aforementioned photovoltaic device 10, 10B, and 10C, the semiconductor substrate 1, the antireflective film 2, and the electrodes 4 to 6 (or 6A and 6B) or includes, among the members of the aforementioned photovoltaic device 10A, the semiconductor substrate 1A, the first amorphous semiconductor layers 31, the second amorphous semiconductor layers 32, and the electrodes 4 to 6 (or 6A and 6B).

Figure 16:
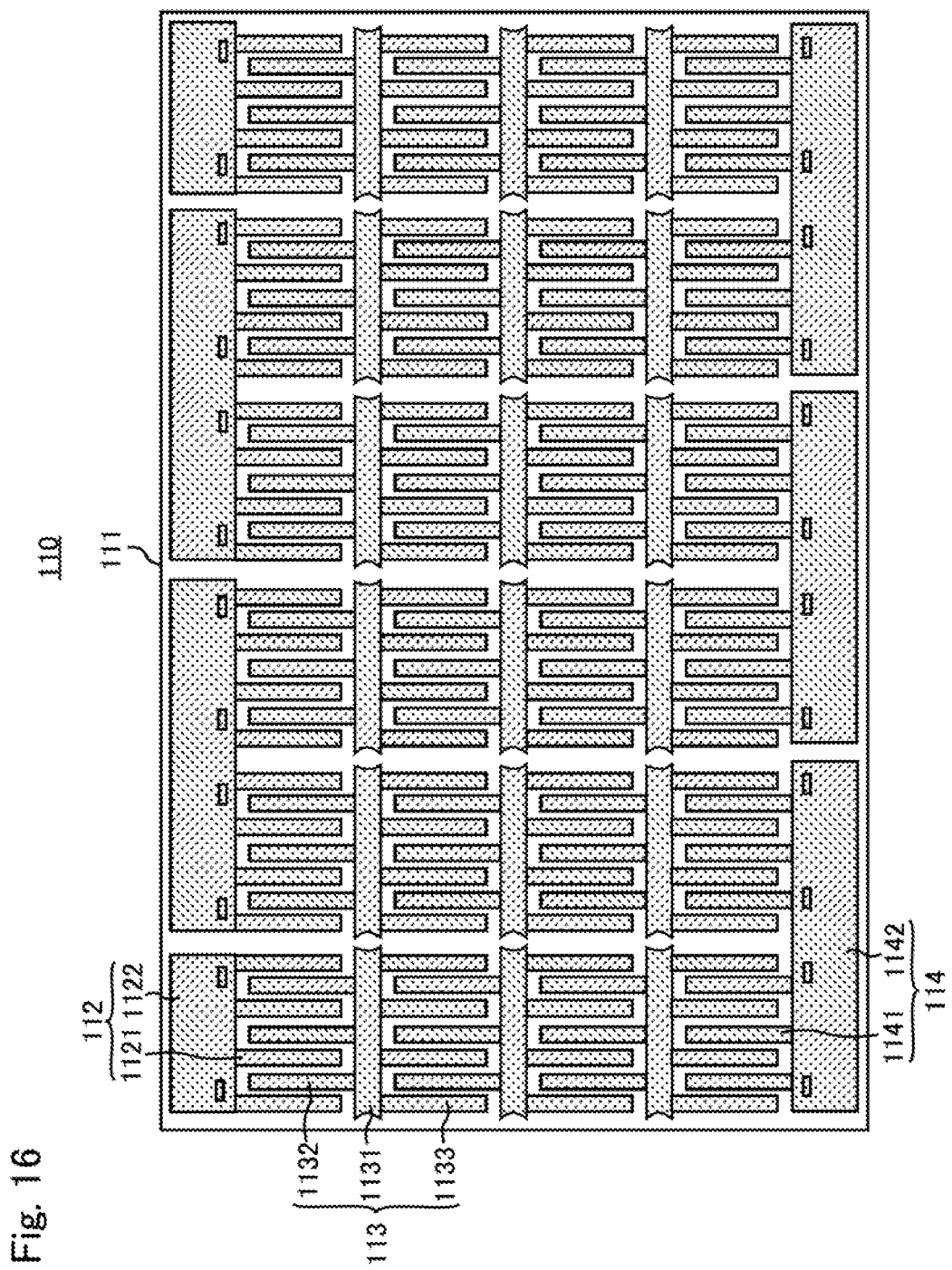
FIG. 16 is a plan view of a wiring board shown in FIG. 15.

FIG. 16 is a plan view of the wiring board 110 shown in FIG. 15. Referring to FIG. 16, the wiring board 110 includes an insulating substrate 111 and wires 112 to 114.

The insulating substrate 111 may be made of any insulating base material such as a film of polyester, polyethylene naphthalate, or polyimide. The insulating substrate 111 has the same thickness as the insulating substrate 81.

Each wire 112 includes a plurality of wires 1121 and a wire 1122. The wires 1121 are arranged parallel to each other such that each wire 1121 has an end connected to the wire 1122. The wires 1121 project in a single direction from the wire 1122.

Each wire 113 includes a wire 1131, a plurality of wires 1132, and a plurality of wires 1133. The wires 1132 are arranged parallel to each other. The wires 1133 are also arranged parallel to each other.

Each wire 1132 has an end connected to the wire 1131. The wires 1132 project in a single direction from the wire 1131.

Each wire 1133 has an end connected to the wire 1131. The wires 1133 project from the wire 1131 in a direction opposite to the direction in which the wires 1132 project.

Each wire 114 includes a plurality of wires 1141 and a wire 1142. The wires 1141 are arranged parallel to each other such that each wire 1141 has an end connected to the wire 1142. The wires 1141 project in a single direction from the wire 1142.

The wiring board 110 includes two wires 112, eighteen wires 113, and five wires 114 on the insulating substrate 111. In this example, the wires 1121 of each wire 112 are arranged to alternate with the wires 1132 of an associated one of the wires 113 between these wires 112 and 113. Between two adjacent wires 113, the wires 1132 of one of the wires 113 are arranged to alternate with the wires 1133 of the other wire 113. The wires 1132 or 1133 of each wire 113 are arranged to alternate with the wires 1141 of an associated one of the wires 114 between these wires 113 and 114.

Arranging twenty-four solar cells 120 in a 4×6 matrix on the wiring board 110 as described here electrically connects the twenty-four solar cells 120 in series.

The wires 112 to 114 are composed of a conductive material such as copper, silver-plated copper, or tin-plated copper.

The wires 1131, 1132, 1133, and 1141 may be formed, for example, by providing a metal or like conductive film across the entire surface of the insulating substrate 111 and then etching out or otherwise removing portions of the conductive film for patterning.

The string 100 of back-contact solar cells each with a wiring board prepared in this manner is scaled with, for example, a resin by a conventionally known method, to obtain a solar cell module.

The string 100 of solar cells connected as described here is sandwiched between EVA (ethylene vinyl acetate) films serving as an encapsulant and then further sandwiched between a glass plate (surface-protection layer) and a back face film of, for example, an acrylic resin. The bubbles trapped between the EVA films are removed by depressurization (laminated). The EVA films are then heated (cured), so that the EVA can cure, which seals the back-contact solar cells. Thereafter, an aluminum frame is fitted along the outer circumference of the sealed string of solar cells, and a terminal box is connected to a pair of external terminals extending outwards. That completes the manufacture of the solar cell module.

Since each individual back-contact solar cell (solar cell 120) in the solar cell module structured in this manner has improved properties, the solar cell module has its properties synergistically improved. Furthermore, since the back-contact solar cells (solar cells 120) in the solar cell module can be easily connected with each other, the solar cell module is fabricated more easily and in a more reliable manner.

A description will now be given of examples of the invention.

Example 1

Photovoltaic devices were fabricated as Example 1 in accordance with Embodiment 2, and their properties were evaluated. Specifically, the photovoltaic devices were fabricated as in the following.

First, a 150-μm thick wafer was cut out from a 156-mm n-type bulk silicon. The wafer was then etched to remove damaged layers on the water surface and also to adjust the thickness of the wafer. A protective film was formed on one of the faces of the etched wafer. The protective film was a silicon nitride film. The wafer on which a protective film had been formed was then wet-etched using an aqueous solution of KOH (1 to 5 wt %) and isopropyl alcohol (1 to 10 wt %). The protective film was removed after the wet etching.

An antireflective film 2 composed of a silicon oxide film and a silicon nitride film would be formed subsequently on the light-receiving face of the semiconductor substrate 1A. A surface of the semiconductor substrate 1A was first subjected to thermal oxidation to form an oxide film on the light-receiving face of the semiconductor substrate 1A. A silicon nitride film was then formed on the oxide film on the light-receiving face, so as to form the antireflective film 2.

Next, as an i-type amorphous semiconductor layer 311, 5-nm, hydrogen-containing, practically intrinsic amorphous silicon film was formed in a plasma CVD device under the following conditions. Silane gas and hydrogen gas were introduced as reactant gases into a reaction chamber of the plasma CVD device. The temperature of the semiconductor substrate 1A was 200° C., the flow rate of the hydrogen gas was 100 sccm, the flow rate of the silane (SiH$_4$) gas was 40 sccm, the pressure inside the reaction chamber was 100 Pa, and the high-frequency (13.56 MHz) electric power density was 10 mW/cm$^2$.

Subsequently, a 10-nm p-type amorphous semiconductor layer 312 was formed on the i-type amorphous semiconductor layer 311.

The p-type amorphous semiconductor layer 312 was formed by plasma CVD under the following conditions. Silane gas, hydrogen gas, and hydrogen-diluted diborane (B$_2$H$_6$) gas (diborane concentration was 2%) were introduced as reactant gases into a reaction chamber of the plasma CVD device. The flow rate of the hydrogen gas was 100 sccm, the flow rate of the silane gas was 40 sccm, the flow rate of the diborane gas was 40 sccm, the temperature of the semiconductor substrate 1A was 200° C., the pressure inside the reaction chamber was 100 Pa, and the high-frequency (13.56 MHz) electric power density was 10 mW/cm$^2$.

A commercially available etching paste 26 was applied onto the p-type amorphous semiconductor layer 312 by screen printing. Next, the etching paste 26 was heated to 200° C. for 10 minutes, in order to partly etching away the stack of the i-type amorphous semiconductor layer 24 and the p-type amorphous semiconductor layer 25 in the thickness direction thereof. The semiconductor substrate 1A was cleaned in an ultrasonic bath for 10 minutes to remove the etched silicon film and the etching paste 26 (solid solution). These procedures exposed portions of the back face of the semiconductor substrate 1A as shown in step (g) in FIG. 11.

Next, as an i-type amorphous semiconductor layer 27, a 5-nm hydrogen-containing, practically intrinsic amorphous silicon film was formed in a plasma CVD device under the following conditions. Silane gas and hydrogen gas were introduced as reactant gases into a reaction chamber of the plasma CVD device. The temperature of the semiconductor substrate 1A was 200° C., the flow rate of the hydrogen gas was 100 sccm, the flow rate of the silane (SiH$_4$) gas was 40 sccm, the pressure inside the reaction chamber was 100 Pa, and the high-frequency (13.56 MHz) electric power density was 10 mW/cm$^2$.

Subsequently, a 10-nm n-type amorphous semiconductor layer 28 was formed on the i-type amorphous semiconductor layer 27.

The n-type amorphous semiconductor layer 28 was formed by plasma CVD under the following conditions. Silane gas, hydrogen gas, and hydrogen-diluted phosphine (PH$_3$) gas (phosphine concentration was, for example, 1%) were introduced as reactant gases into a reaction chamber of the plasma CVD device. The temperature of the semiconductor substrate 1A was 170° C., the flow rate of the hydrogen gas was 100 sccm, the flow rate of the silane gas was 40 sccm, the flow rate of the phosphine gas was 40 sccm, the pressure inside the reaction chamber was 40 Pa, and the high-frequency (13.56 MHz) electric power density was 8.33 mW/cm$^2$.

Next, an etching mask 29 was formed on the n-type amorphous semiconductor layer 28 as shown in step (i) in FIG. 11, by applying a commercially available photoresist by screen printing and thoroughly drying the applied photoresist. The semiconductor substrate 1A was then immersed in a 1% KOH solution using the etching mask 29 as a mask.

The stack of the i-type amorphous semiconductor layer 27 and the n-type amorphous semiconductor layer 28 was partly etched away in the thickness direction thereof, to expose portions of the p-type amorphous semiconductor layer 312. Thereafter, the etching mask 29 was removed using an SPM cleaning solution.

After the formation of the n-type amorphous semiconductor layer 322, the electrodes 5 and the electrodes 4 and 6 were formed respectively on the n-type amorphous semiconductor layer 322 and the p-type amorphous semiconductor layer 312.

These patterns were formed using a metal mask for the electrodes 5 and 6 and another metal mask for the electrodes 4. The metal masks were prepared as detailed in the follows.

The electrodes 5 and 6 were formed by placing a metal mask on the semiconductor substrate 1A and depositing silver to a thickness of 200 nm by sputtering. Thereafter, the electrodes 4 were formed by depositing silver to a thickness of 200 nm by sputtering.

The metal masks had the following patterns.

The electrodes 5 had a width of 300 μm. The electrodes 4 had a width of 800 μm. The electrodes 5 and 4 had a repetition pitch of 1.5 mm. The electrodes 5 had an outer periphery with an end region located 1,000 μm inside an edge of the semiconductor substrate 1A. The electrodes 4 had an outer periphery with an end region located 500 μm inside an edge of the semiconductor substrate 1A. The electrodes 6 were positioned 200 μm away from the ends of the electrodes 4 and had a width of 200 μm and a length of 300 μm. The non-opening portions had a width of 200 μm. The metal mask had a thickness specified at 200 μm in view of mechanical strength. Also in view of mechanical strength, the openings were divided approximately at every 10 mm along the length direction to provide for 200-μm non-opening portions.

Subsequently, as shown in step (1) in FIG. 12, a commercially available insulating resin was applied by screen printing to form the non-connecting regions 15 in portions of the electrodes 5. Next, the non-connecting regions 16 were formed similarly on portions of the electrodes 4.

Next, a commercially available low-melting-point solder composed primarily of bismuth and tin was disposed by printing as a conductive adhesive 7 on the electrodes 5, 4, and 6.

Next, as shown in step (m) in FIG. 12, a wiring board 8 was prepared. The semiconductor substrate 1A and the wiring board 8 were attached together, with their positions adjusted in such a manner that the electrodes 4 and 5 would be substantially perpendicular to the wires 82 and 83 respectively in order to establish electrical contacts in prescribed locations.

Next, the attached semiconductor substrate 1A and wiring board 8 were heated at 200° C. for 10 minutes under pressure applied thereto from both sides thereof, to electrically join them. Twenty back-contact solar cells each with a wiring board were fabricated by the process described above.

The outer peripheries of the back-contact solar cells thus fabricated were observed both visually and under an optical microscope. The electrodes 4 and 6 had beautiful patterns near the edges of the substrate.

Thereafter, the semiconductor substrates 1A were sandwiched between commercially available glass, a back sheet of PET resin, and EVA and laminated to prepare a module.

Example 2

Example 2 was the same as Example 1, except that electrodes 6A were formed in the pattern shown in FIG.

13A. The pattern was formed using a metal mask for the electrodes 5 and parts of the electrodes 6A and another metal mask for the electrodes 4 and parts of the electrodes 6A. The metal masks were prepared as detailed in the follows.

The electrodes 5 and parts of the electrodes 6A were formed by placing a metal mask on the semiconductor substrate 1A and depositing silver to a thickness of 200 nm by sputtering. Thereafter, the electrodes 4 and parts of the electrodes 6A were formed by depositing silver to a thickness of 200 nm by sputtering. Twenty back-contact solar cells each with a wiring board were fabricated by the process described above. Otherwise, Example 2 was the same as Example 1.

The outer peripheries of the back-contact solar cells thus fabricated were observed both visually and under an optical microscope. The electrodes 4 and 6A had beautiful patterns near the edges of the substrate.

Example 3

Example 3 was the same as Example 1, except that electrodes 6B were formed in the pattern shown in FIG. 14A. The electrodes 5, 4, and 6B were formed by placing a common metal mask on the semiconductor substrate 1A and depositing silver to a thickness of 200 nm by sputtering.

Twenty back-contact solar cells 100 each with a wiring board were fabricated by the process described above. Otherwise, Example 3 was the same as Example 1.

The outer peripheries of the back-contact solar cells thus fabricated were observed both visually and under an optical microscope. The electrodes 4 and 6B had beautiful patterns near the edges of the substrate.

Comparative Example 1

Photovoltaic devices were fabricated as Comparative Example 1. There were provided no electrodes 6 (or 6A, or 6B) and no non-connecting regions 15 and 16. The electrodes 4 and 5 were formed 500 μm inside the outer periphery of the semiconductor substrate 1A, so that the electrodes 4 could surround the electrodes 5.

Next, a wiring board 8 was prepared. The semiconductor substrate 1A and the wiring board 8 were attached together, with their positions adjusted in such a manner that the electrodes 4 and 5 would be substantially parallel to the wires 82 and 83 respectively in order to establish electrical contacts in prescribed locations.

Next, the attached semiconductor substrate 1A and wiring board 8 were, for example, heated to 200° C. for 10 minutes under pressure applied thereto from both sides thereof, to electrically join them. Twenty back-contact solar cells each with a wiring board were fabricated by the process described above. Otherwise, Comparative Example 1 was the same as Example 1.

The outer peripheries of the back-contact solar cells thus fabricated were observed both visually and under an optical microscope. Some electrodes ran out of patterns near the edges of the substrate. Electrodes on some substrates were broken due to patterning defects.

The conversion efficiency of each photovoltaic device fabricated was measured using a solar simulator, and their average values were calculated. The conversion efficiency, relative to that of Example 1, was 1.01 in Example 2, 1.01 in Example 3, and 0.93 in Comparative Example 1. These results show that Examples 1, 2, and 3 have better properties than Comparative Example 1.

In the comparative example, one of the back-contact solar cells fabricated clearly had degraded properties due to improper insulation that was probably a defect in the formation of electrodes. On the other hand, good contacts were established in all the back-contact solar cells fabricated in Examples 1 to 3.

The fabricated photovoltaic devices were left at 85° C. and 85% humidity in a high temperature, high humidity bath for 1 month. The conversion efficiency was then measured again using a solar simulator. The conversion efficiency, relative to that of Example 1, was 0.99 in Example 2, 1.01 in Example 2, and 0.91 in Comparative Example 1. These results show that Examples 1 to 3 have better properties than Comparative Example 1.

The y-axis direction is a first direction, and the x-axis direction is a second direction, throughout the embodiments of the present invention.

Throughout the embodiments of the present invention, the n-type diffusion layers 12 or the second amorphous semiconductor layers 32, both arranged in the y-axis direction, constitute a "plurality of first semiconductor layers," and the p-type diffusion layers 11 or the first amorphous semiconductor layers 31, both arranged in the y-axis direction, constitute a "plurality of second semiconductor layers."

Again throughout the embodiments of the present invention, the electrodes 50, arranged in the x-axis direction, constitute a "plurality of first electrodes," and the electrodes 40, arranged in the x-axis direction, constitute a "plurality of second electrodes."

The embodiments disclosed herein are for illustrative purposes only in every respect and provide no basis for restrictive interpretations. The scope of the present invention is defined only by the claims and never bound by the embodiments. Those modifications and variations which may lead to equivalents of claimed elements are all included within the scope of the invention.

INDUSTRIAL APPLICABILITY

The present invention is applicable to photovoltaic devices, solar cell strings of photovoltaic devices, and solar cell modules including either a photovoltaic device or a solar cell string.

The invention claimed is:

1. A photovoltaic device comprising:
a semiconductor substrate of a first conductivity type;
a first semiconductor layer of the first conductivity type disposed on one of two faces of the semiconductor substrate, the first semiconductor layer including regions spaced apart from each other in a first direction;
a second semiconductor layer of a second conductivity type disposed on the face of the semiconductor substrate, the second semiconductor layer including regions arranged alternately with the first semiconductor layer when viewed along the first direction, the second conductivity type being opposite to the first conductivity type;
a plurality of first electrodes disposed on the first semiconductor layer, the first electrodes being spaced apart from each other in the first direction and having a length in a second direction perpendicular to the first direction;
a plurality of second electrodes disposed on the second semiconductor layer, the second electrodes being spaced apart from each other in the first direction and having a length in the second direction;

first wires connected electrically to the first electrodes, the first wires extending in the first direction;

second wires connected electrically to the second electrodes, the second wires extending in the first direction;

first non-connecting regions disposed between those second electrodes which are adjacent in the first direction, the first non-connecting regions inhibiting electrical connection between the first electrodes and the second wires;

second non-connecting regions disposed between those first electrodes which are adjacent in the first direction, the second non-connecting regions inhibiting electrical connection between the second electrodes and the first wires; and a plurality of third electrodes disposed between at least one of two ends of the first semiconductor layer with respect to the second direction and an edge of the semiconductor substrate facing the at least one end, the third electrodes being connected electrically to the second wires.

2. The photovoltaic device according to claim 1, wherein at least one of two ends of each of the second electrodes is, with respect to the second direction, located closer to the edge of the semiconductor substrate than an end of the associated one of the first electrodes is to the edge.

3. The photovoltaic device according to claim 1, wherein the third electrodes are positioned in line with the first electrodes with respect to the second direction.

4. The photovoltaic device according to claim 3, wherein the third electrodes and the first electrodes have substantially equal widths.

5. The photovoltaic device according to claim 1, wherein the third electrodes are positioned between the second electrodes spaced apart from each other in the first direction near the edge of the semiconductor substrate with respect to the second direction.

6. The photovoltaic device according to claim 1, wherein at least one of the first and second semiconductor layers is an amorphous semiconductor layer.

7. A solar cell string comprising:
a plurality of photovoltaic elements; and
a wiring board connected electrically to the photovoltaic elements, wherein the photovoltaic elements each include:
a semiconductor substrate of a first conductivity type;
a first semiconductor layer of the first conductivity type disposed on one of two faces of the semiconductor substrate, the first semiconductor layer including regions spaced apart from each other in a first direction;
a second semiconductor layer of a second conductivity type disposed on the face of the semiconductor substrate, the second semiconductor layer including regions arranged alternately with the first semiconductor layer when viewed along the first direction, the second conductivity type being opposite to the first conductivity type;
a plurality of first electrodes disposed on the first semiconductor layer, the first electrodes being spaced apart from each other in the first direction and having a length in a second direction perpendicular to the first direction;
a plurality of second electrodes disposed on the second semiconductor layer, the second electrodes being spaced apart from each other in the first direction and having a length in the second direction;
first non-connecting regions disposed between those second electrodes which are adjacent in the first direction;
second non-connecting regions disposed between those first electrodes which are adjacent in the first direction; and
a plurality of third electrodes disposed between at least one of two ends of the first semiconductor layer with respect to the second direction and an edge of the semiconductor substrate facing the at least one end,
the wiring board includes:
first wires connected electrically to the first electrodes, the first wires extending in the first direction; and
second wires connected electrically to the second electrodes and the third electrodes, the second wires extending in the first direction;
the first non-connecting regions inhibit electrical connection between the first electrodes and the second wires, and
the second non-connecting regions inhibit electrical connection between the second electrodes and the first wires.

8. A solar cell module comprising the photovoltaic device according to claim 1 sealed with resin.

* * * * *